(12) United States Patent
Takahashi et al.

(10) Patent No.: US 9,817,032 B2
(45) Date of Patent: Nov. 14, 2017

(54) MEASUREMENT DEVICE

(71) Applicant: Semiconductor Energy Laboratory Co., Ltd., Atsugi-shi, Kanagawa-ken (JP)

(72) Inventors: Kei Takahashi, Kanagawa (JP); Noboru Inoue, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 185 days.

(21) Appl. No.: 13/895,841

(22) Filed: May 16, 2013

(65) Prior Publication Data

US 2013/0314074 A1 Nov. 28, 2013

(30) Foreign Application Priority Data

May 23, 2012 (JP) .................. 2012-117197

(51) Int. Cl.
*G01R 1/36* (2006.01)
*G01R 1/067* (2006.01)
*G01R 31/27* (2006.01)
*G09G 3/00* (2006.01)

(52) U.S. Cl.
CPC .......... *G01R 1/36* (2013.01); *G01R 1/06766* (2013.01); *G01R 31/27* (2013.01); *G09G 3/006* (2013.01)

(58) Field of Classification Search
CPC ...... G01R 1/36; G01R 1/06766; G01R 31/27; G01R 22/066; G01R 11/24; G01R 11/04; G01R 11/02; G09G 3/006
See application file for complete search history.

(56) References Cited

U.S. PATENT DOCUMENTS

| | | |
|---|---|---|
| 4,042,881 A | 8/1977 | Webb |
| 4,205,264 A | 5/1980 | Gold |
| 4,473,857 A | 9/1984 | Winter |
| 4,646,002 A | 2/1987 | Tuszyski |
| 5,532,608 A | 7/1996 | Behfar-Rad et al. |
| 5,731,856 A | 3/1998 | Kim et al. |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Brodie, Ivor, and Julius J. Muray. The Physics of Microfabrication. New York: Plenum, Published 1982 (pp. 7-15).*

(Continued)

*Primary Examiner* — Melissa Koval
*Assistant Examiner* — Felicia Farrow
(74) *Attorney, Agent, or Firm* — Fish & Richardson P.C.

(57) ABSTRACT

To provide a measurement device which allows long-term accurate measurement of voltage without adversely affecting a device under test, by ensuring a predetermined level of resistance to ESD and reducing leakage current. A measurement device includes a probe needle for contacting a device under test, a first FET for detecting voltage of the device under test, and a protection circuit for protecting the first FET from static electricity. The protection circuit includes a second FET having an oxide semiconductor film as a channel formation region.

18 Claims, 7 Drawing Sheets

(56) References Cited

U.S. PATENT DOCUMENTS

| | | | |
|---|---|---|---|
| 5,744,864 A | 4/1998 | Cillessen et al. |
| 5,877,619 A | 3/1999 | Keller |
| 5,903,143 A | 5/1999 | Mochizuki et al. |
| 6,034,530 A | 3/2000 | Suzuki et al. |
| 6,294,274 B1 | 9/2001 | Kawazoe et al. |
| 6,563,174 B2 | 5/2003 | Kawasaki et al. |
| 6,603,322 B1 | 8/2003 | Boll et al. |
| 6,727,522 B1 | 4/2004 | Kawasaki et al. |
| 6,731,104 B1 | 5/2004 | Yang |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,067,718 B2 * | 11/2011 | Nordstrom | G01R 1/06772 324/754.08 |
| 8,138,775 B2 * | 3/2012 | Tomblinson | 324/750.01 |
| 8,390,044 B2 | 3/2013 | Kawae et al. |
| 8,507,907 B2 | 8/2013 | Takahashi et al. |
| 8,928,466 B2 | 1/2015 | Kamata |
| 8,941,958 B2 * | 1/2015 | Tomatsu | H01L 27/0266 361/56 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2002/0153919 A1 * | 10/2002 | Murakawa et al. | 324/770 |
| 2003/0184507 A1 | 10/2003 | Nakazaki |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0062890 A1 * | 3/2011 | Oba | 315/294 |
| 2011/0115564 A1 * | 5/2011 | Tung | 330/298 |
| 2013/0077195 A1 * | 3/2013 | Stockinger | 361/56 |
| 2013/0222954 A1 * | 8/2013 | Demange | H02H 9/046 361/56 |

FOREIGN PATENT DOCUMENTS

| | | |
|---|---|---|
| JP | 56-038853 A | 4/1981 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-135049 A | 7/2011 |
| JP | 2011-176294 A | 9/2011 |
| JP | 2012-053866 A | 3/2012 |
| WO | 2004/114391 A1 | 12/2004 |
| WO | WO-2011/065209 | 6/2011 |
| WO | WO-2011/093003 | 8/2011 |

OTHER PUBLICATIONS

Fortunato et al, "Oxide Semiconductor Thin-Film Transistors: A Review of Recent Advances", vol. 24, issue 22, pp. 2945-2986, published May 10, 2012.*

Ohara, H et al., "Amorphous In—Ga—Zn-Oxide TFTs with Suppressed Variation for 4.0 inch QVGA AMOLED Display," AM-FPD

(56) References Cited

OTHER PUBLICATIONS

'09 Digest of Technical Papers, Jul. 1, 2009, pp. 227-230, The Japan Society of Applied Physics.
Orita, M et al., "Amorphous transparent conductive oxide InGaO3(ZnO)m (m<4):a Zn4s conductor," Philosophical Magazine, 2001, vol. 81, No. 5, pp. 501-515.
Orita, M et al., "Mechanism of Electrical Conductivity of Transparent InGaZnO4," Phys. Rev. B (Physical Review. B), Jan. 15, 2000, vol. 61, No. 3, pp. 1811-1816.
Osada, T et al., "15.2: Development of Driver-Integrated Panel using Amorphous In—Ga—Zn-Oxide TFT," SID Digest '09 : SID International Symposium Digest of Technical Papers, May 31, 2009, pp. 184-187.
Osada, T et al., "Development of Driver-Integrated Panel Using Amorphous In—Ga—Zn-Oxide TFT," AM-FPD '09 Digest of Technical Papers, Jul. 1, 2009, pp. 33-36.
Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.
Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.
Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.
Park, J et al., "High performance amorphous oxide thin film transistors with self-aligned top-gate structure," IEDM 09: Technical Digest of International Electron Devices Meeting, Dec. 7, 2009, pp. 191-194.
Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.
Park, J et al., "Amorphous Indium-Gallium-Zinc Oxide TFTs and Their Application for Large Size AMOLED," AM-FPD '08 Digest of Technical Papers, Jul. 2, 2008, pp. 275-278.
Park, S et al., "Challenge to Future Displays: Transparent AM-OLED Driven by PEALD Grown ZnO TFT," IMID '07 Digest, 2007, pp. 1249-1252.
Prins, M et al., "A Ferroelectric Transparent Thin-Film Transistor," Appl. Phys. Lett. (Applied Physics Letters), Jun. 17, 1996, vol. 68, No. 25, pp. 3650-3652.
Sakata, J et al., "Development of 4.0-In. AMOLED Display With Driver Circuit Using Amorphous In—Ga—Zn-Oxide TFTs," IDW '09 : Proceedings of the 16th International Display Workshops, 2009, pp. 689-692.
Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.
Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.
Tsuda, K et al., "Ultra Low Power Consumption Technologies for Mobile TFT-LCDs," IDW '02 : Proceedings of the 9th International Display Workshops, Dec. 4, 2002, pp. 295-298.
Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.
Van De Walle, C, "Hydrogen as a Cause of Doping in Zinc Oxide," Phys. Rev. Lett. (Physical Review Letters), Jul. 31, 2000, vol. 85, No. 5, pp. 1012-1015.
Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.
Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.
Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.
Clark, S et al., "First Principles Methods Using CASTEP," Zeitschrift fur Kristallographie, 2005, vol. 220, pp. 567-570.
Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.
Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.
Dembo, H et al., "RFCPUs on Glass and Plastic Substrates Fabricated by TFT Transfer Technology," IEDM 05: Technical Digest of International Electron Devices Meeting, Dec. 5, 2005, pp. 1067-1069.
Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.
Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.
Godo, H et al., "P-9: Numerical Analysis on Temperature Dependence of Characteristics of Amorphous In—Ga—Zn-Oxide TFT," SID Digest '09 : SID International Symposium Digest of Technical Papers, May 31, 2009, pp. 1110-1112.
Godo, H et al., "Temperature Dependence of Characteristics and Electronic Structure for Amorphous In—Ga—Zn-Oxide TFT," AM-FPD '09 Digest of Technical Papers, Jul. 1, 2009, pp. 41-44.
Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.
Hirao, T et al., "Novel Top-Gate Zinc Oxide Thin-Film Transistors (ZnO TFTs) for AMLCDs," Journal of the SID , 2007, vol. 15, No. 1, pp. 17-22.
Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.
Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.
Ikeda, T et al., "Full-Functional System Liquid Crystal Display Using CG-Silicon Technology," SID Digest '04 : SID International Symposium Digest of Technical Papers, 2004, vol. 35, pp. 860-863.
Janotti, A et al., "Native Point Defects in ZnO," Phys. Rev. B (Physical Review. B), 2007, vol. 76, No. 16, pp. 165202-1-165202-22.
Janotti, A et al., "Oxygen Vacancies in ZnO," Appl. Phys. Lett. (Applied Physics Letters), 2005, vol. 87, pp. 122102-1-122102-3.
Jeong, J et al., "3.1: Distinguished Paper: 12.1-Inch WXGA AMOLED Display Driven by Indium-Gallium-Zinc Oxide TFTs

(56) References Cited

OTHER PUBLICATIONS

Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and SC2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUs on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn-Oxide TFTs With a Novel Passivation Layer," SID Digest '09 : SID International Symposium Digest of Technical Papers, May 31, 2009, pp. 284-287.

\* cited by examiner

PRIOR ART

MEASUREMENT DEVICE

BACKGROUND OF THE INVENTION

1. Field of the Invention

The present invention relates to a measurement device, and in particular, relates to a measurement device used for electrically measuring and checking an electrical circuit.

2. Description of the Related Art

For the purpose of operation verification tests or failure analysis, an active probe is used to measure internal voltages in integrated circuits of, for example, display devices typified by LSIs, LCDs, and OLEDs. An FET probe, which is a typical example of an active probe, includes a field effect transistor (FET) that is an active element and a passive element, and further, a power source is used. With an active probe having such a structure, higher input impedance (e.g., 1 MΩ or greater) and lower input capacitance (e.g., 1 pF or less) than a passive probe constituted by C (capacitor) and R (resistor) can be achieved, and a waveform can be observed while a device under test (DUT) is not adversely affected as much as possible.

The leakage current of an active probe is low. For example, an active probe with leakage current of approximately $10^{-14}$ A is commonly used.

REFERENCE

Patent Document

[Patent Document 1] U.S. Pat. No. 4,646,002

SUMMARY OF THE INVENTION

In order to obtain such a probe with high input impedance and low input capacitance, a circuit using a bipolar transistor or a junction transistor as an element for input signal detection is formed in Patent Document 1, for example. However, since these elements are each controlled by passing current from an input to an output, the leakage current is inevitably generated in accordance with the operation principle. The generation of the leakage current in the elements for detection results in reducing accuracy of measuring potentials of devices under test.

A field-effect transistor whose channel formation region is formed using an oxide semiconductor film and whose leakage current is very low is hereinafter referred to as an OS-FET. In the case where such an OS-FET is used in an electrical circuit which is a device under test, with the use of a conventional probe, variation in voltage occurs because the leakage current of the probe is too high; hence, accurate change in voltage data cannot be observed.

FIG. 1A shows a pixel circuit 100 in which an OS-FET 101 is used as a switch for holding image data. A gate of the OS-FET 101 is electrically connected to a gate signal line 102, and one of a source and a drain of the OS-FET 101 is electrically connected to a source signal line 103. The other of the source and the drain of the OS-FET 101 is electrically connected to one of a pair of electrodes included in a capacitor 104 and one of opposing electrodes (a pixel electrode) included in a liquid crystal element 105. The image data is written from the source signal line 103 to a node 107 via the OS-FET 101. Here, for example, when the capacitance of the capacitor 104 is assumed to be 80 fF (femtofarad) and the capacitance of the liquid crystal element 105 is assumed to be 20 fF, the sum of the capacitances of the capacitor 104 and the liquid crystal element 105 is 100 fF.

FIG. 1B shows the case where image data written to the node 107 is continuously measured for a long time using a conventional probe 106 in which the leakage current is as low as $10^{-14}$ A. As shown in FIG. 1B, when the measurement is performed using the probe 106 for 1 second in a hold period, voltage varies by 0.1 V from the actual voltage of the image data in the case where the capacitance is 100 fF. For example, in the case where image data of a voltage of up to 5 V is held in one pixel, when the image data has 256 gray levels, the voltage corresponding to one gray level is approximately 20 mV. Hence, the variation in voltage is larger than the voltage corresponding to one gray level.

The cause of such leakage current is as follows. In addition to an FET for voltage detection, a protection circuit including a Metal-Oxide-Semiconductor (MOS) FET (hereinafter referred to as MOSFET) is provided in order to protect against overvoltage due to electrostatic discharge (ESD) at the time of detection. In the MOSFET, gate leakage is often generated, which is a cause of low leakage current.

As a method for detecting voltage in a state without leakage current, there is a method in which a MOSFET without gate leakage is used as an FET for voltage detection and a circuit for protection against overvoltage at the time of detection is not provided. In this case, however, a gate of the MOSFET does not have a path for electric charge to escape. Thus, electric charge is accumulated, thereby easily causing breakdown of the gate insulating film.

An object of the present invention is to provide a measurement device which allows long-term accurate measurement of voltage without adversely affecting a device under test, by ensuring a predetermined level of resistance to ESD and by reducing leakage current.

In the case where an FET for detection and an overvoltage protection circuit are provided over different element substrates, there are a risk of ESD occurring in a portion where the element substrates are connected to each other and a risk of adding a factor in causing leakage current.

Another object of the present invention is to provide a measurement device in which the above-described risks are reduced as much as possible and which allows long-term accurate measurement of voltage without adversely affecting a device under test, by ensuring a predetermined level of resistance to ESD and by reducing leakage current.

In view of any of the foregoing objects, according to one embodiment of the present invention, a MOSFET is used for an FET for detecting voltage of a device under test, and an OS-FET whose off-state leakage current is very low is electrically connected to a gate of the MOSFET. Thus, it is possible to measure voltage for a long time without adversely affecting the device under test while ensuring resistance to ESD.

An oxide semiconductor which is used for a channel formation region of an OS-FET is a semiconductor material whose band gap is wider than that of silicon and whose intrinsic carrier density is lower than that of silicon. With a channel formation region including a semiconductor material having the above characteristics, a transistor with an extremely low off-state current can be obtained. As such a semiconductor material, for example, an oxide semiconductor, silicon carbide, gallium nitride, or the like which has approximately three times as wide band gap as silicon can be given. An FET including the semiconductor material can have much lower off-state current than an FET including a normal semiconductor material such as silicon or germanium.

One embodiment of the present invention is a measurement device including a probe needle for contacting a device under test, a first FET for detecting voltage of the device under test, and a protection circuit for protecting the first FET from static electricity. The protection circuit includes a second FET having an oxide semiconductor film as a channel formation region.

A specific structure of one embodiment of the present invention is, for example, a measurement device including a probe needle, first to fourth FETs, a high-potential-side first power supply line, a low-potential-side second power supply line, and a wiring for applying a bias potential. In the measurement device, a gate of the first FET is electrically connected to the probe needle, a gate and a drain of the second FET, and a source of the third FET; a drain of the first FET is electrically connected to the first power supply line; a source of the first FET is electrically connected to a drain of the fourth FET; a source of the second FET is electrically connected to the first power supply line; a gate and a drain of the third FET is electrically connected to the second power supply line; a gate of the fourth FET is electrically connected to the wiring; a source of the fourth FET is electrically connected to the second power supply line; and the second FET and the third FET each include an oxide semiconductor film as a channel formation region.

Another specific structure of one embodiment of the present invention is a measurement device including a probe needle, first to third FETs, and a high-potential-side power supply line. In the measurement device, a gate of the first FET is electrically connected to the probe needle, a gate and a drain of the second FET, and a source of the third FET; a drain of the first FET is electrically connected to the power supply line; a source of the first FET is electrically connected to a gate and a drain of the third FET; a source of the second FET is electrically connected to the power supply line; and the second FET and the third FET each include an oxide semiconductor film as a channel formation region.

Another specific structure of one embodiment of the present invention is a measurement device including a probe needle, first to fourth FETs, a high-potential-side first power supply line, a low-potential-side second power supply line, and a wiring for applying a bias potential. In the measurement device, a gate of the first FET is electrically connected to the probe needle, a gate and a drain of the second FET, and a source of the third FET; a drain of the first FET is electrically connected to the second power supply line; a source of the first FET is electrically connected to a drain of the fourth FET; a source of the second FET is electrically connected to the first power supply line; a gate and a drain of the third FET are electrically connected to the second power supply line; a gate of the fourth FET is electrically connected to the wiring; a source of the fourth FET is electrically connected to the first power supply line; and the second FET and the third FET each include an oxide semiconductor film as a channel formation region.

Another specific structure of one embodiment of the present invention is a measurement device including a probe needle, first to third FETs, and a low-potential-side power supply line. In the measurement device, a gate of the first FET is electrically connected to the probe needle, a gate and a drain of the second FET, and a source of the third FET; a drain of the first FET is electrically connected to the power supply line; a source of the first FET is electrically connected to a source of the second FET; a drain of the third FET is electrically connected to the power supply line; and the second FET and the third FET each include an oxide semiconductor film as a channel formation region.

Here, the leakage current of the second FET in an off state and/or the third FET in an off state in the protection circuit is preferably less than or equal to $10^{-24}$ A.

Further, the first FET for voltage detection and the second FET and/or the third FET in the protection circuit are preferably stacked on one element substrate.

In accordance with one embodiment of the present invention, it is possible to provide a measurement device which allows long-term accurate measurement of voltage without adversely affecting a device under test, by ensuring a predetermined level of resistance to ESD and by reducing leakage current.

Further, in accordance with one embodiment of the present invention, it is possible to provide a measurement device in which a risk of ESD occurring between the FET for voltage detection and the protection circuit and a risk of adding a factor in causing leakage current are reduced as much as possible and which allows long-term accurate measurement of voltage without adversely affecting a device under test, by ensuring a predetermined level of resistance to ESD and by reducing leakage current.

DETAILED DESCRIPTION OF THE INVENTION

Embodiments of the invention disclosed in this specification will be described below with reference to the accompanying drawings. Note that the invention disclosed in this specification is not limited to the following description, and it is easily understood by those skilled in the art that modes and details can be variously changed. Therefore, the invention disclosed in this specification is not construed as being limited to the description of the following embodiments.

Note that ordinal numbers such as first and second are used for convenience and thus do not indicate a proper name as an item for specifying the present invention in this specification.

The term "electrically connected" or "electrical connection" includes the case where components are connected via an "object having any electric function". There is no particular limitation on the object having any electric function as long as electric signals can be transmitted and received between the components connected through the object. Examples of an "object having any electric function" are a switching element such as a transistor, a resistor, an inductor, a capacitor, and an element with a variety of functions as well as an electrode and a wiring.

Embodiment 1

In this embodiment, one mode of a measurement device will be described with reference to FIGS. 2A and 2B.

Figure 1A:
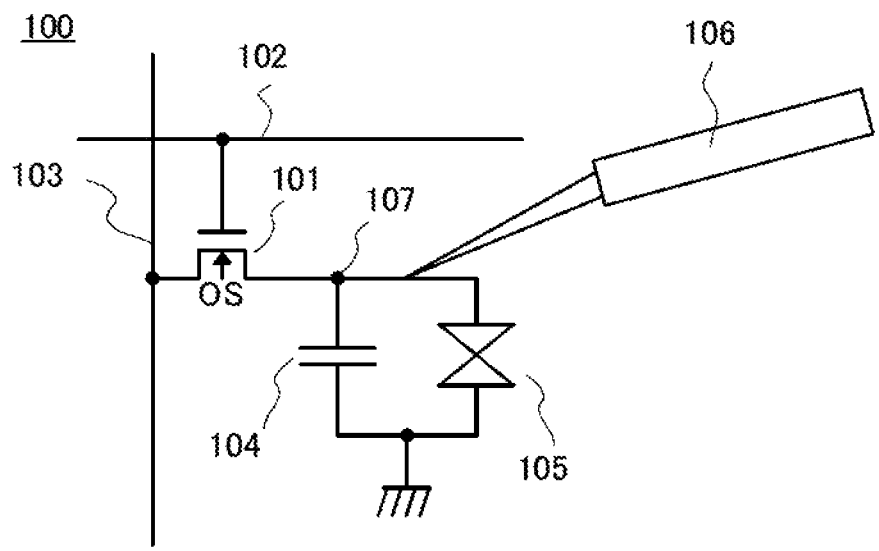
FIGS. 1A and 1B illustrate an example of measurement using a conventional probe and a relation between hold time and hold voltage.
Figure 1B:
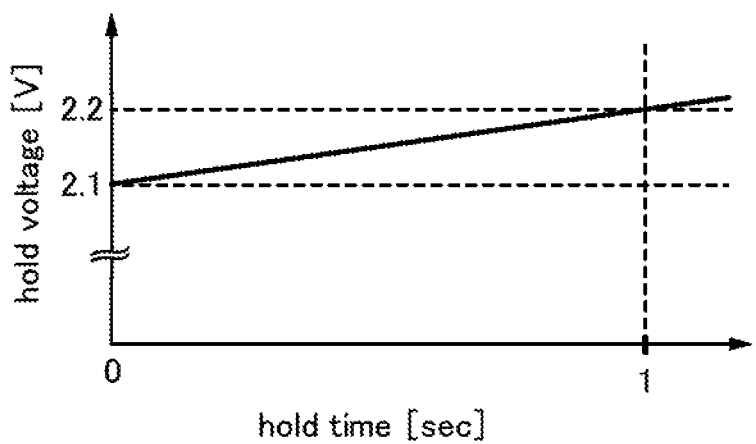
Figure 2A:
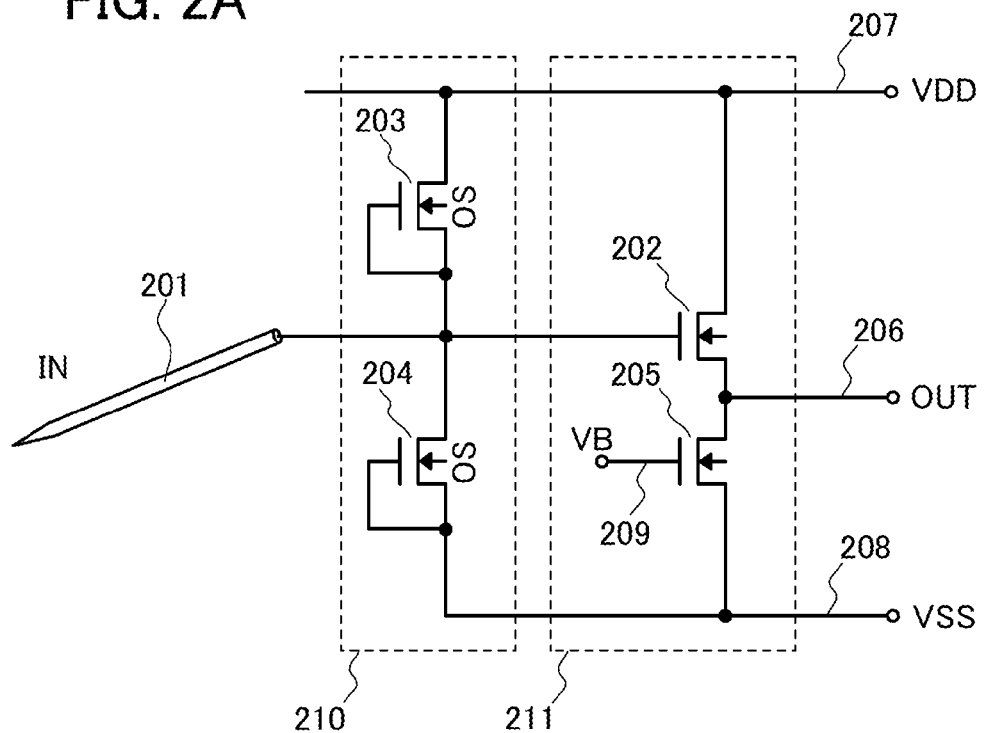
FIGS. 2A and 2B are circuit diagrams illustrating one mode of a measurement device.
Figure 2B:
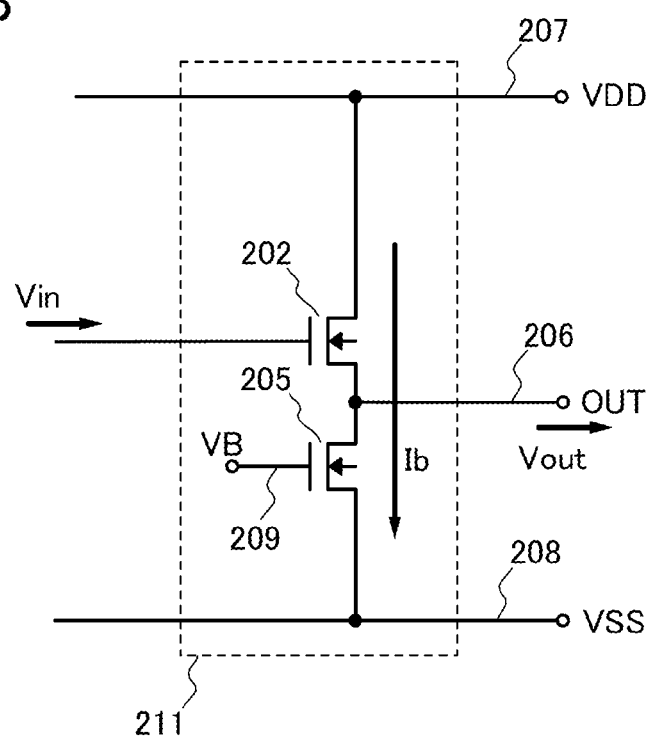

FIG. 2A shows a circuit configuration of an input end of a measurement device, or more specifically, an active probe. In this embodiment, the active probe includes a probe needle 201, a protection circuit portion 210, and a detecting portion 211. The detecting portion 211 in this embodiment includes a power supply line 207 for applying a high-potential-side potential (VDD), a power supply line 208 for applying a low-potential-side potential (VSS: ground potential), and an output terminal 206. Thus, the detecting portion 211 is a circuit having three output terminals.

By physical contact with a device under test, the probe needle 201 serves as an interface for inputting, to the measurement device, voltage of a portion where the probe needle contacts the device under test (hereinafter the portion is referred to as contact portion). Therefore, the probe needle 201 is preferably formed using a material making a good electrical contact with the device under test. Further, the probe needle 201 is necessary to have strength (rigidity, mechanical elasticity, or the like) against external stress which is applied at the time of the measurement. Thus, the probe needle 201 can be formed using, for example, tungsten, steel, tungsten carbide, palladium, beryllium, osmium, copper, alloy containing two or more kinds of these materials, or a material formed by covering any of these materials with gold or the like. The diameter of the probe needle 201 can be determined in accordance with the shape of the contact portion (e.g., a metal pad) in terms of satisfying any of a variety of demand characteristics such as strength. For example, the diameter of the probe needle 201 can be greater than or equal to 0.1 μm and less than or equal to 100 μm. The probe needle 201 is electrically connected to the detecting portion 211 via the protection circuit portion 210.

The detecting portion 211 includes two transistors, i.e. a MOSFET 202 and a MOSFET 205. In this embodiment, both of the MOSFETs 202 and 205 are n-channel transistors. The MOSFET 202 serves as a transistor for voltage detection. A gate of the MOSFET 202 is electrically connected to the probe needle 201, a drain of the MOSFET 202 is electrically connected to the power supply line 207 for applying a high-potential-side potential (VDD), and a source of the MOSFET 202 is electrically connected to a drain of the MOSFET 205 and the output terminal 206. The MOSFET 205 serves as a constant current source in the detecting portion. A gate of the MOSFET 205 is electrically connected to a wiring 209 for applying a bias potential (VB), and a source of the MOSFET 205 is electrically connected to the power supply line 208 for applying a low-potential-side potential (VSS: ground potential).

With the above-described connection of the FETs, the detecting portion 211 forms a source follower circuit. A weak signal input from the probe needle 201 is output to the output terminal 206 via the MOSFET 202. Here, the operation of the source follower circuit is described with reference to FIG. 2B.

In the detecting portion 211 forming the source follower circuit, the gate of the MOSFET 202 that is a transistor for voltage detection serves as an input terminal; an input potential Vin is input to the gate of the MOSFET 202. The source of the MOSFET 202 for voltage detection is electrically connected to the output terminal 206, so that a potential of the source of the MOSFET 202 is an output potential Vout. Here, it is assumed that a bias potential VB is applied to the gate of the MOSFET 205 and, when the MOSFET 205 operates in a saturation region, current Ib flows in the MOSFET 205. In that case, since the MOSFET 202 and the MOSFET 205 are connected in series, the same amount of current flows in the MOSFET 202 and the MOSFET 205. That is, when the current Ib flows in the MOSFET 205, the current Ib also flows in the MOSFET 202.

The output potential Vout in the source follower circuit is lower than the input potential Vin by gate-source voltage Vgs of the MOSFET 202. At this time, the relation among the input potential Vin, the output potential Vout, and the gate-source voltage Vgs satisfies the following formula (1).

$$Vout = Vin - Vgs \qquad \text{formula (1)}$$

Thus, the voltage Vout output from the MOSFET 202 to the output terminal 206 is obtained by subtracting Vgs, which is to be an offset potential, from the voltage Vin input to the gate of the MOSFET 202. The offset potential Vgs is generally expressed by a function of threshold voltage, mobility, or the like of the MOSFET 202. Therefore, when a transistor with less characteristic variation in threshold voltage, e.g., a transistor including single crystal silicon in a channel formation region is used as the MOSFET 202, the output potential Vout is proportional to the input potential Vin.

Hence, the source follower circuit can be used as an output buffer, whereby a signal input using the probe needle 201 can be detected even when the output terminal 206 is connected to a high-impedance device.

Note that the circuit configuration of the detecting portion 211 is not limited to the source follower circuit, and a different circuit configuration may be used. For example, a circuit configuration using an operational amplifier may be used.

The protection circuit portion 210 includes two OS-FETs 203 and 204 as shown in FIG. 2A, for example. Both of these OS-FETs 203 and 204 are n-channel transistors. A source of the OS-FET 203 is electrically connected to the power supply line 207 for supplying a high-potential-side potential (VDD), and a drain of the OS-FET 203 is electrically connected to a gate of the OS-FET 203 (the OS-FET 203 is a diode-connected transistor). A drain of the OS-FET 204 is electrically connected to the power supply line 208 for supplying a low-potential-side potential (VSS: ground potential) and electrically connected to a gate of the OS-FET 204 (the OS-FET 204 is a diode-connected transistor). The OS-FET 203 and the OS-FET 204 are electrically connected in series. Specifically, the drain of the OS-FET 203 and a source of the OS-FET 204 are electrically connected to each other. The probe needle 201 and the gate of the MOSFET 202 for voltage detection are electrically connected to a point where the OS-FET 203 and the OS-FET 204 are electrically connected to each other.

Next, the operation of the protection circuit portion 210 is described.

The protection circuit portion 210 prevents excessive voltage due to ESD or the like from being applied to the MOSFET 202 for voltage detection in the detecting portion 211. The protection circuit portion 210 has a function of, in the case where excessive voltage (overvoltage) is input to the probe needle 201, allowing the voltage to be distributed across other wirings (the power supply lines 207 and 208) electrically connected to the protection circuit portion to instantaneously reduce voltage, in order to prevent the overvoltage from being directly applied to the MOSFET 202 for voltage detection.

The OS-FET 203 is provided between a wiring which connects the probe needle 201 to the gate of the MOSFET 202 for voltage detection and the power supply line 207. The OS-FET 203 is electrically connected to the power supply line 207 for applying a high-potential-side potential. The OS-FET 203 is a two-terminal element in which the gate and the drain are connected to each other. Therefore, in the case where positive voltage of higher than or equal to threshold voltage Vth of the OS-FET 203 is applied to the drain of the OS-FET 203, the voltage is also applied to the gate of the OS-FET 203, so that a conduction state (ON state) is provided between the source and the drain of the OS-FET 203.

In a normal condition, a non-conduction state (OFF state) is provided between the source and the drain of the OS-FET 203. When positive overvoltage is applied to the probe needle 201 owing to ESD or the like, since the positive overvoltage is sufficiently higher than the threshold voltage Vth of the OS-FET 203, the overvoltage is applied to the gate of the OS-FET 203, so that a conduction state is provided between the source and the drain of the OS-FET 203. Thus, via the OS-FET 203, current instantaneously flows into the power supply line 207 for applying a high-potential-side potential, and accordingly, voltage to be applied to the gate of the MOSFET 202 for voltage detection is much reduced. In this manner, the MOSFET 202 for voltage detection is protected. Note that when positive overdischarge is applied to the probe needle 201, the OS-FET 204 is in a non-conduction state.

The OS-FET 204 is also a two-terminal element in which the gate and the drain are connected to each other. Therefore, in the case where positive voltage of higher than or equal to threshold voltage Vth of the OS-FET 204 is applied to the drain of the OS-FET 204, the voltage is also applied to the gate of the OS-FET 204, so that a conduction state (ON state) is provided between the source and the drain of the OS-FET 204.

In a normal condition, a non-conduction state (OFF state) is provided between the source and the drain of the OS-FET 204. When negative overvoltage is applied to the probe needle 201 owing to ESD or the like, the negative overvoltage is applied to the source of the OS-FET 204. Thus, voltage sufficiently higher than the threshold voltage Vth is relatively applied to the gate and the drain of the OS-FET 204, so that a conductive state is provided between the source and the drain of the OS-FET 204. Hence, via the OS-FET 204, current instantaneously flows into the probe needle 201 from the power supply line 208 for applying a low-potential-side potential (ground potential), and accordingly, voltage to be applied to the gate of the MOSFET 202 for voltage detection is much increased. In this manner, the MOSFET 202 for voltage detection is protected. Note that when negative overvoltage is applied to the probe needle 201, the OS-FET 203 is in a non-conduction state.

With the use of the diode-connected OS-FET 203 and the diode-connected OS-FET 204 in the protection circuit portion 210 in the above-described manner, the MOSFET 202 for voltage detection can be protected against overvoltage.

Here, as described above, the OS-FETs 203 and 204 are kept in a non-conduction state (OFF state) in normal operation of the measurement device. If high leakage current is generated in an OFF state, voltage input from the probe needle 201 varies, and therefore, change of voltage data cannot be observed accurately. However, since an oxide semiconductor is included in a channel formation region of each of the OS-FETs 203 and 204 according to the present invention, the off-state leakage current is very low; for example, the off-state leakage current is less than or equal to $10^{-24}$ A.

From the above, by ensuring a predetermined level of resistance to ESD and by reducing leakage current, voltage can be accurately measured for a long time without adversely affecting the device under test.

Note that although only two diode-connected OS-FETs are used in the protection circuit portion 210 in this embodiment, the number of OS-FETs is not limited thereto. For example, a plurality of diode-connected OS-FETs may be further provided in series between the OS-FET 203 and the power supply line 207. Similarly, a plurality of diode-connected OS-FETs may be further provided in series between the OS-FET 204 and the power supply line 208. By thus increasing the number of diode-connected OS-FETs, the resistance of the protection circuit to pressure can be increased, and further, leakage current in the protection circuit portion 210 can be further reduced.

This embodiment can be implemented in an appropriate combination with any of the other embodiments described in this specification.

Embodiment 2

In Embodiment 1, the measurement device including the detecting portion having three output terminals is described. In this embodiment, a measurement device including a detecting portion having two output terminals will be described with reference to FIG. 3.

Figure 3:
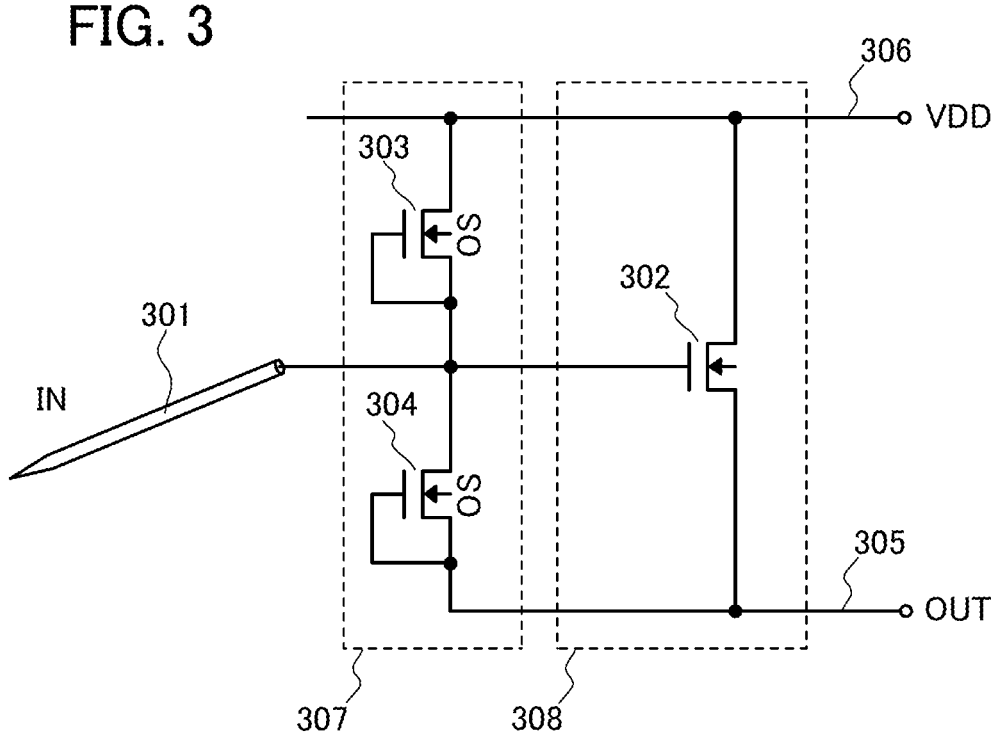
FIG. 3 is a circuit diagram illustrating one mode of a measurement device.

FIG. 3 shows a circuit configuration of an input end of a measurement device, or more specifically, an active probe. In this embodiment, the active probe includes a probe needle 301, a protection circuit portion 307, and a detecting portion 308. The detecting portion 308 in this embodiment includes a power supply line 306 for applying a high-potential-side potential (VDD) and an output terminal 305. Thus, the detecting portion 308 is a circuit having two output terminals.

The probe needle 301 is electrically connected to the detecting portion 308 via the protection circuit portion 307.

The detecting portion 308 includes a MOSFET 302. In this embodiment, the MOSFET 302 is an n-channel transistor. The MOSFET 302 serves as a transistor for voltage detection. A gate of the MOSFET 302 is electrically connected to the probe needle 301, a drain of the MOSFET 302 is electrically connected to the power supply line 306 for applying a high-potential-side potential (VDD), and a source of the MOSFET 302 is electrically connected to the output terminal 305.

The protection circuit portion 307 has almost the same configuration as the protection circuit portion 210 described in Embodiment 1. The protection circuit portion 307 includes two OS-FETs 303 and 304. Both of these OS-FETs 303 and 304 are n-channel transistors. A source of the OS-FET 303 is electrically connected to the power supply line 306 for supplying a high-potential-side potential (VDD), and a drain of the OS-FET 303 is electrically connected to a gate of the OS-FET 303 (the OS-FET 303 is a diode-connected transistor). A drain of the OS-FET 304 is electrically connected to the output terminal 305 and electrically connected to a gate of the OS-FET 304 (the OS-FET 304 is a diode-connected transistor). The OS-FET 303 and the OS-FET 304 are electrically connected in series. Specifically, the drain of the OS-FET 303 and a source of the OS-FET 304 are electrically connected to each other. The probe needle 301 and the gate of the MOSFET 302 for voltage detection are electrically connected to a point where the OS-FET 303 and the OS-FET 304 are electrically connected to each other.

Although the detecting portion 308 in this embodiment has two output terminals, the output terminal 305 can be electrically connected to a constant current source provided outside the detecting portion 308, so that a source follower circuit including the detecting portion 308 can be formed.

The detecting portion 308 in this embodiment has two output terminals and thus can function with fewer terminals than the detecting portion 211 described in Embodiment 1. On the other hand, as compared to the measurement device in Embodiment 1, the OS-FET 304 acts as a parasitic capacitance between the probe needle 301 (input terminal) and the output terminal 305 in some cases. For this reason, the measurement device in Embodiment 1 and the measurement device in this embodiment may be used as appropriate in accordance with a device under test, measurement conditions, and the like.

From the above, by ensuring a predetermined level of resistance to ESD and by reducing leakage current, voltage can be accurately measured for a long time without adversely affecting the device under test.

This embodiment can be implemented in an appropriate combination with any of the other embodiments described in this specification.

Embodiment 3

In Embodiment 1, the case of using n-channel MOSFETs in the detection portion having three output terminals in the measurement device is described. In this embodiment, the case of using p-channel MOSFETs will be described with reference to FIG. 4.

Figure 4:
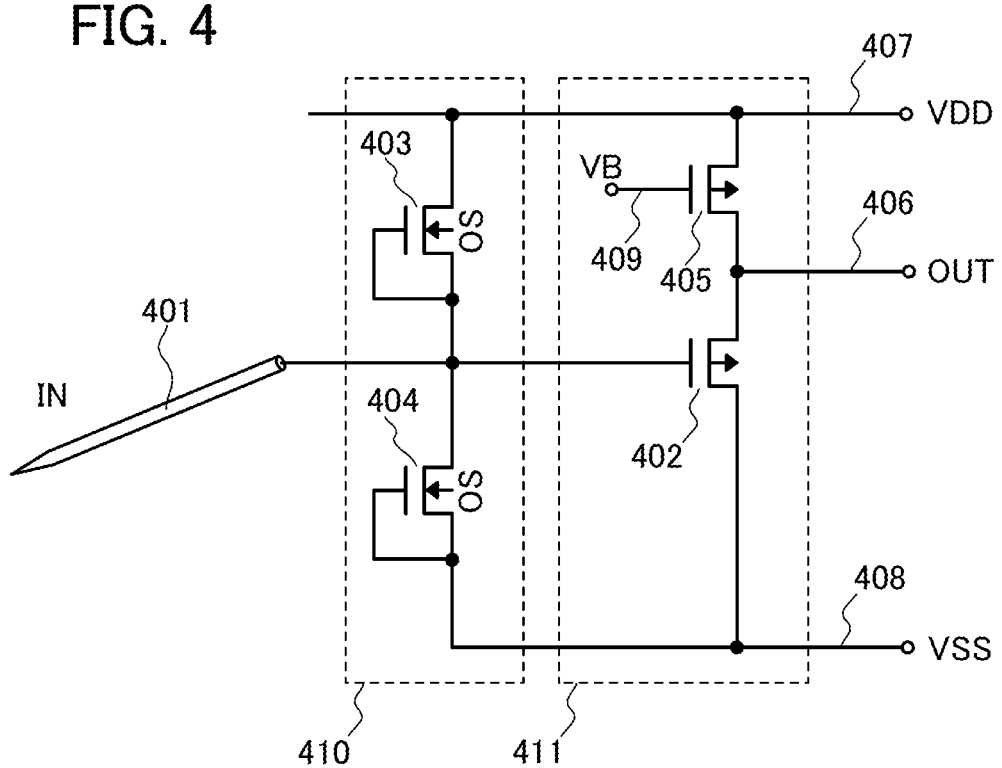
FIG. 4 is a circuit diagram illustrating one mode of a measurement device.

FIG. 4 shows a circuit configuration of an input end of a measurement device, or more specifically, an active probe. In this embodiment, the active probe includes a probe needle 401, a protection circuit portion 410, and a detecting portion 411. The detecting portion 411 in this embodiment includes a power supply line 407 for applying a high-potential-side potential (VDD), a power supply line 408 for applying a low-potential-side potential (VSS: ground potential), and an output terminal 406. Thus, the detecting portion 411 is a circuit having three output terminals.

The probe needle 401 is electrically connected to the detecting portion 411 via the protection circuit portion 410.

The detecting portion 411 includes two transistors, i.e. a MOSFET 402 and a MOSFET 405. In this embodiment, both of the MOSFETs 402 and 405 are p-channel transistors. The MOSFET 402 serves as a transistor for voltage detection. A gate of the MOSFET 402 is electrically connected to the probe needle 401, a source of the MOSFET 402 is electrically connected to a drain of the MOSFET 405 and the output terminal 406, and a drain of the MOSFET 402 is electrically connected to the power supply line 407 for applying a low-potential-side potential (VSS: ground potential). The MOSFET 405 serves as a constant current source in the detecting portion. A gate of the MOSFET 405 is electrically connected to a wiring 409 for applying a bias potential (VB), and a source of the MOSFET 405 is electrically connected to the power supply line 407 for applying a high-potential-side potential (VDD).

The protection circuit portion 410 has the same configuration as the protection circuit portion 210 described in Embodiment 1. The protection circuit portion 410 includes two OS-FETs 403 and 404. Both of these OS-FETs 403 and 404 are n-channel transistors. A source of the OS-FET 403 is electrically connected to the power supply line 407 for supplying a high-potential-side potential (VDD), and a drain of the OS-FET 403 is electrically connected to a gate of the OS-FET 403 (the OS-FET 403 is a diode-connected transistor). A drain of the OS-FET 404 is electrically connected to the power supply line 408 for supplying a low-potential-side potential (VSS: ground potential) and electrically connected to a gate of the OS-FET 404 (the OS-FET 404 is a diode-connected transistor). The OS-FET 403 and the OS-FET 404 are electrically connected in series. Specifically, the drain of the OS-FET 403 and a source of the OS-FET 404 are electrically connected to each other. The probe needle 401 and the gate of the MOSFET 402 for voltage detection are electrically connected to a point where the OS-FET 403 and the OS-FET 404 are electrically connected to each other.

With the use of the p-channel MOSFETs in the detecting portion 411, noise can be reduced as compared to the case of using the n-channel MOSFETs in Embodiment 1. On the other hand, the n-channel MOSFET has higher field-effect mobility. For this reason, the measurement device in Embodiment 1 and the measurement device in this embodiment may be used as appropriate in accordance with a device under test, measurement conditions, and the like.

From the above, by ensuring a predetermined level of resistance to ESD and by reducing leakage current, voltage can be accurately measured for a long time without adversely affecting the device under test.

This embodiment can be implemented in an appropriate combination with any of the other embodiments described in this specification.

Embodiment 4

In Embodiment 2, the case of using n-channel MOSFETs in the detection portion having two output terminals in the measurement device is described. In this embodiment, the case of using p-channel MOSFETs will be described with reference to FIG. 5.

Figure 5:
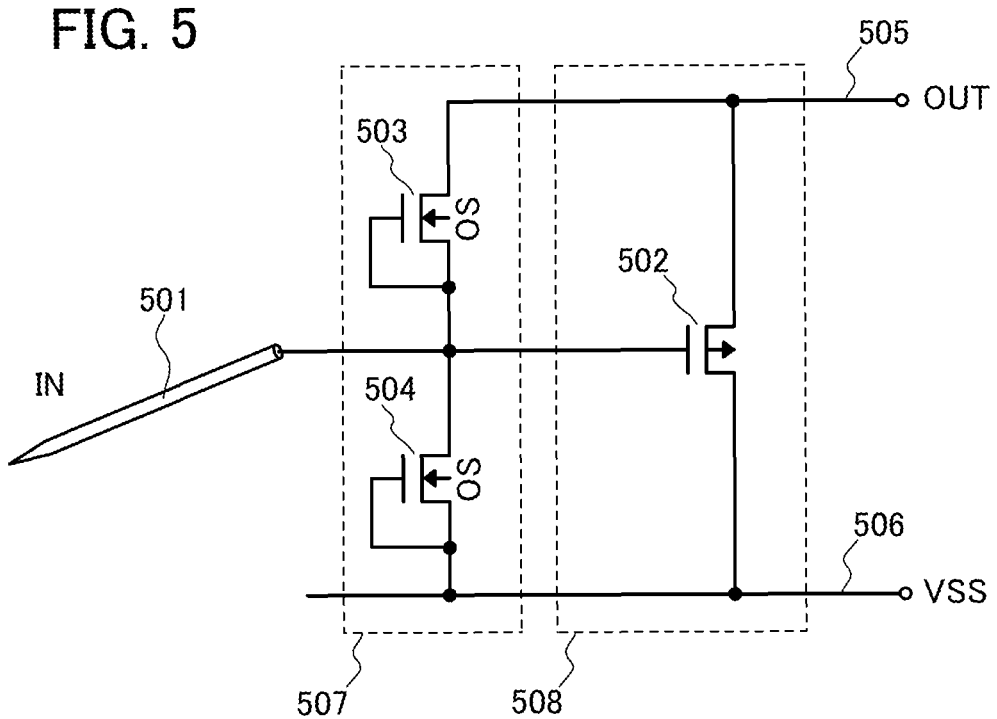
FIG. 5 is a circuit diagram illustrating one mode of a measurement device.

FIG. 5 shows a circuit configuration of an input end of a measurement device, or more specifically, an active probe. In this embodiment, the active probe includes a probe needle 501, a protection circuit portion 507, and a detecting portion 508. The detecting portion 508 in this embodiment includes a power supply line 506 for applying a low-potential-side potential (VSS: ground potential) and an output terminal 505. Thus, the detecting portion 508 is a circuit having two output terminals.

The probe needle 501 is electrically connected to the detecting portion 508 via the protection circuit portion 507.

The detecting portion 508 includes a MOSFET 502. In this embodiment, the MOSFET 502 is a p-channel transistor. The MOSFET 502 serves as a transistor for voltage detection. A gate of the MOSFET 502 is electrically connected to the probe needle 501, a drain of the MOSFET 502 is electrically connected to the power supply line 506 for applying a low-potential-side potential (VSS: ground potential), and a source of the MOSFET 502 is electrically connected to the output terminal 505.

The protection circuit portion 507 has almost the same configuration as the protection circuit portion 210 described in Embodiment 1. The protection circuit portion 507 includes two OS-FETs 503 and 504. Both of the OS-FETs 503 and 504 are n-channel transistors. A source of the OS-FET 503 is electrically connected to the output terminal 505, and a drain of the OS-FET 503 is electrically connected to a gate of the OS-FET 503 (the OS-FET 503 is a diode-connected transistor). A drain of the OS-FET 504 is electrically connected to a gate of the OS-FET 504 (the OS-FET 504 is a diode-connected transistor) and electrically connected to the power supply line 506 for supplying a low-potential-side potential (VSS: ground potential). The OS-FET 503 and the OS-FET 504 are electrically connected in series. Specifically, the drain of the OS-FET 503 and a source of the OS-FET 504 are electrically connected to each other. The probe needle 501 and the gate of the MOSFET 502 for voltage detection are electrically connected to a point where the OS-FET 503 and the OS-FET 504 are electrically connected to each other.

Although the detecting portion 508 in this embodiment has two output terminals, the output terminal 505 can be electrically connected to a constant current source provided outside the detecting portion 508, so that a source follower circuit including the detecting portion 508 can be formed.

The detecting portion 508 in this embodiment has two output terminals and thus can function with fewer terminals than the detecting portion 411 described in Embodiment 3. On the other hand, as compared to the measurement device in Embodiment 3, the OS-FET 503 acts as a parasitic capacitance between the probe needle 501 (input terminal) and the output terminal 505 in some cases. For this reason, the measurement device in Embodiment 3 and the measurement device in this embodiment may be used as appropriate in accordance with a device under test, measurement conditions, and the like.

From the above, by ensuring a predetermined level of resistance to ESD and by reducing leakage current, voltage can be accurately measured for a long time without adversely affecting the device under test.

This embodiment can be implemented in an appropriate combination with any of the other embodiments described in this specification.

Embodiment 5

Figure 6:
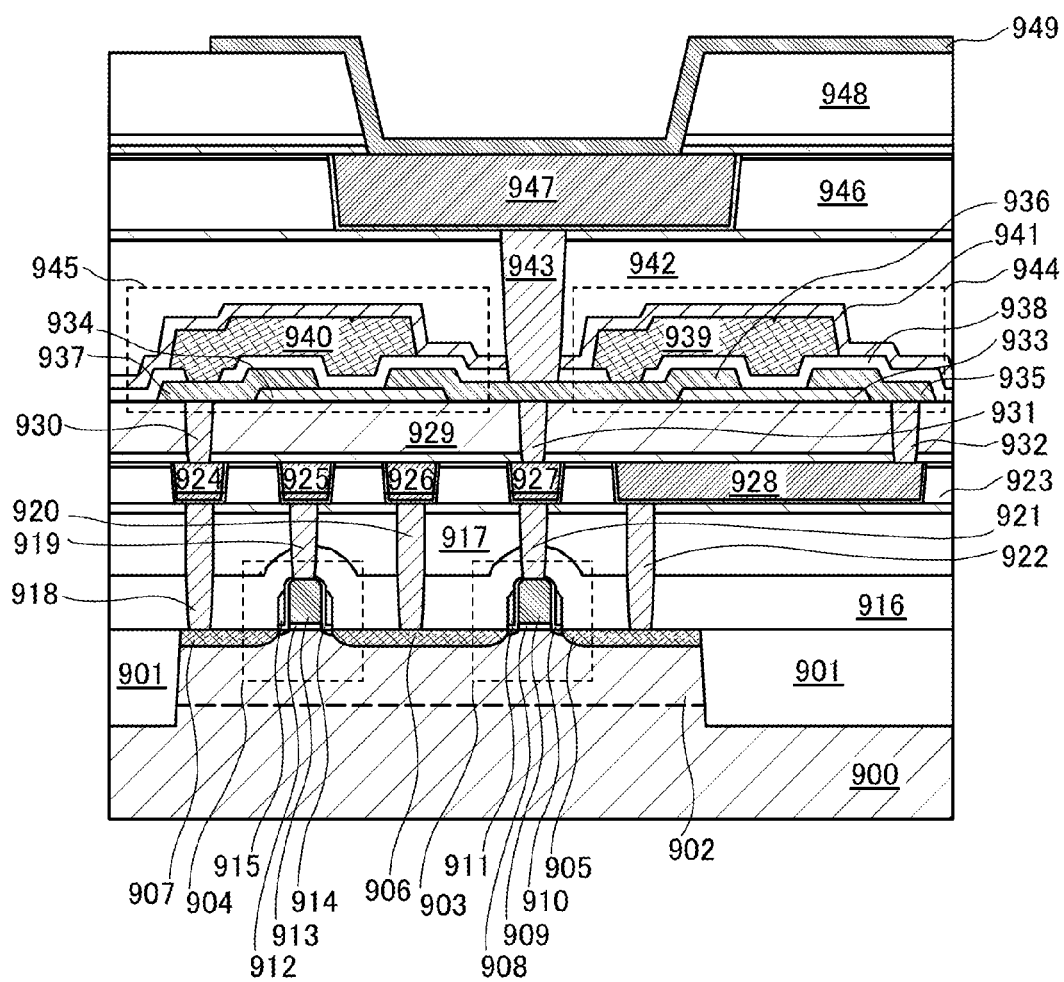
FIG. 6 is a cross-sectional view illustrating one mode of a semiconductor device.

Referring to FIG. 6, this embodiment will illustrate an example of a cross-sectional structure and a fabrication method of the FET described in Embodiment 1 in which a single crystal silicon wafer is used for a channel formation region of each of MOSFETs 202 and 205 and an oxide semiconductor is used for a channel formation region of each of OS-FETs 203 and 204.

Note that a semiconductor material such as germanium, silicon germanium, or single crystal silicon carbide as well as silicon can be used for the channel formation region of the MOSFET 202 and the MOSFET 205. For example, the transistor including silicon can be formed using a single crystal semiconductor substrate such as a silicon wafer, a silicon thin film which is formed by an SOI method, a silicon thin film which is formed by a vapor deposition method, or the like. In this case, a glass substrate formed by a fusion process or a float process, a quartz substrate, a semiconductor substrate, a ceramic substrate, or the like can be used. As the glass substrate, a substrate having a strain point of 730° C. or higher may be used when the temperature of later heat treatment is high. Further, an oxide semiconductor used for a protection circuit may be used for the MOSFET 202 and the MOSFET 205.

FIG. 6 illustrates an embodiment of a cross-sectional structure showing the circuit structures of the protection circuit portion 210 and the detecting portion 211 in the measurement device described in Embodiment 1. In this case, a MOSFET 903 and a MOSFET 904 using a single crystal silicon wafer correspond to the MOSFET 202 and the MOSFET 205 in Embodiment 1, and an OS-FET 944 and an OS-FET 945 using an oxide semiconductor above the MOSFET 903 and the MOSFET 904 correspond to the OS-FET 203 and the OS-FET 204 in Embodiment 1. In other words, the measurement device described in this embodiment is a measurement device that has a three-dimensional layered structure in which a silicon wafer is used as a substrate and an oxide semiconductor film is provided above the silicon wafer. Moreover, the measurement device in this embodiment is a hybrid measurement device including a transistor in which silicon is used for a channel formation region and a transistor in which an oxide semiconductor is used for a channel formation region.

Although only a cross section of the structures of the protection circuit portion and the detecting portion of the measurement device is shown in this embodiment, another circuit to which a signal output from the detecting portion is input can be configured with this layered structure. Thus, the whole of the protection circuit portion and the detecting portion can be integrated in this layered structure. Thus, the MOSFET 202 for voltage detection in the detecting portion can be provided to be extremely close to the protection circuit. Hence, it is possible to inhibit ESD, which occurs when the MOSFET 202 and the protection circuit are provided for different element substrates, from occurring in a portion where the substrates are connected to each other. Further, it is possible to inhibit leakage current from occurring.

Each of the MOSFET 903 and the MOSFET 904 which is formed using a substrate 900 containing a semiconductor material can be either an n-channel transistor (NMOSFET) or a p-channel transistor (PMOSFET). In this embodiment, both the MOSFET 903 and the MOSFET 904 are NMOSFETs on the basis of Embodiment 1. In the example illustrated in FIG. 6, the MOSFET 903 and the MOSFET 904 are electrically isolated from other elements by a shallow trench isolation (STI) 901. The use of the STI 901 can reduce generation of a bird's beak, which may be caused by a LOCOS element isolation method, in an element isolation region and can reduce the size of the element isolation region. On the other hand, in a semiconductor device that is not required to be structurally miniaturized or downsized, the STI 901 is not necessarily formed and an element isolation means such as LOCOS can be used. In the substrate 900 where the MOSFET 903 and the MOSFET 904 are formed, a well 902 to which an impurity imparting conductivity, such as boron, phosphorus, or arsenic, is added is formed.

The MOSFET 903 in FIG. 6 includes a channel formation region in the substrate 900, impurity regions 905 and 906 provided such that the channel formation region is placed therebetween, a gate insulating film 908 over the channel formation region, and a gate electrode layer 909 provided over the gate insulating film 908 to overlap with the channel formation region. As for the impurity regions 905 and 906, the impurity region 905 serves as a drain region of the MOSFET 903 and the impurity region 906 serves as a source region of the MOSFET 903.

Similarly, the MOSFET 904 includes a channel formation region in the substrate 900, the impurity region 906 and an impurity region 907 provided such that the channel formation region is placed therebetween, a gate insulating film 912 over the channel formation region, and a gate electrode layer 913 provided over the gate insulating film 912 to overlap with the channel formation region. As for the impurity regions 906 and 907, the impurity region 906 serves as a drain region of the MOSFET 904 and the impurity region 907 serves as a source region of the MOSFET 904.

Although not shown, the gate electrode layers 909 and 913 can each have a stacked structure of a gate electrode layer including a first material for increasing processing accuracy and a gate electrode layer including a second material for decreasing the resistance as a wiring. For example, the gate electrode layer can have a stacked structure of crystalline silicon to which an impurity imparting conductivity, such as phosphorus, is added and nickel silicide. Note that the structure is not limited to this, and materials, the number of stacked layers, the shape, or the like can be adjusted as appropriate depending on required specifications.

Note that each of the MOSFETs 903 and 904 in FIG. 6 may be a fin-type transistor. In a fin-type structure, part of a semiconductor substrate is processed into a plate-shaped protrusion, and a gate electrode layer is provided to cross the protrusion in the longitudinal direction. The gate electrode layer covers an upper surface and side surfaces of the protrusion with a gate insulating film placed between the gate electrode layer and the protrusion. With the MOSFETs 903 and 904 each having a fin-type structure, the channel width can be reduced to achieve higher integration of transistors. Moreover, a larger amount of current can flow through the transistor and the control efficiency can be increased, so that the off-state current and threshold voltage of the transistor can be reduced.

Contact plugs 922, 920, and 918 are connected to the impurity regions 905, 906, and 907, respectively, in the substrate 900. Further, contact plugs 921 and 919 are connected to the gate electrode layers 909 and 913, respectively. Here, the contact plugs 922, 920, and 918 also function as a source electrode and a drain electrode of the MOSFETs 903 and 904 to which the contact plugs 922, 920, and 918 are connected. In addition, impurity regions that are different from the impurity regions 905, 906, and 907 are provided between the impurity regions 905, 906, and 907, and the channel region. The impurity regions function as LDD regions or extension regions for controlling the distribution of electric fields in the vicinity of the channel formation region, depending on the concentration of an impurity introduced thereto. Sidewall insulating films 911 and 915 are provided at side surfaces of the gate electrode layers 909 and 913 with insulating films 910 and 914 placed therebetween, respectively. By using these insulating films 910 and 914 and the sidewall insulating films 911 and 915, the LDD regions or extension regions can be formed.

The MOSFETs 903 and 904 are covered with an insulating film 916. The insulating film 916 can function as a protective film and can prevent impurities from entering the channel formation region from the outside. With the insulating film 916 formed by CVD using a material such as silicon nitride, hydrogenation can be performed by heat treatment in the case where single crystal silicon is used for the channel formation region. When an insulating film having tensile stress or compressive stress is used as the insulating film 916, distortion can be provided to the semiconductor material used for the channel formation region. By application of tensile stress to a silicon material used for the channel formation region of an n-channel transistor or application of compressive stress to a silicon material used for the channel formation region of a p-channel transistor, the field-effect mobility of the transistor can be increased.

An insulating film 917 is provided over the insulating film 916, and a surface of the insulating film 917 is planarized by CMP. Consequently, element layers can be stacked with high accuracy above a layer including the MOSFETs 903 and 904.

A layer including the OS-FETs 944 and 945 in each of which an oxide semiconductor film is used for a channel formation region is formed above the layer including the MOSFETs 903 and 904. The OS-FETs 944 and 945 are each a transistor with a top-gate structure. In the OS-FET 944, a source electrode layer 935 and a drain electrode layer 936 are in contact with side surfaces and an upper surface of an oxide semiconductor film 933, so that the source electrode layer 935 and the drain electrode layer 936 are electrically connected to the oxide semiconductor film 933. Further, in the OS-FET 944, a gate electrode layer 939 is provided over a gate insulating film 938 placed over the oxide semiconductor film 933, the source electrode layer 935, and the drain electrode layer 936. Similarly, in the OS-FET 945, a source electrode layer 936 and a drain electrode layer 937 are in contact with side surfaces and an upper surface of an oxide semiconductor film 934, so that the source electrode layer 936 and the drain electrode layer 937 are electrically connected to the oxide semiconductor film 934. Further, in the OS-FET 945, a gate electrode layer 940 is provided over the gate insulating film 938 placed over the oxide semiconductor film 934, the source electrode layer 936, and the drain electrode layer 937. Here, the drain electrode layer 936 to which the OS-FET 944 is electrically connected and the source electrode layer 936 to which the OS-FET 945 is electrically connected are formed using the same wiring, and the wiring is shared by the OS-FETs 944 and 945.

In the OS-FET 944, the gate electrode layer 939 is electrically connected to the drain electrode layer 936 via an opening provided in the gate insulating film 938. The OS-FET 944 is what is called a diode-connected transistor. In the OS-FET 945, the gate electrode layer 940 is electrically connected to the drain electrode layer 937 via an opening provided in the gate insulating film 938. The OS-FET 945 is what is called a diode-connected transistor.

An insulating film 941 is formed over the OS-FETs 944 and 945 to cover the OS-FETs 944 and 945. Here, a method of fabricating the OS-FETs 944 and 945 will be described below.

The oxide semiconductor films 933 and 934 are formed over the insulating film 929. The insulating film 929 can be formed using an inorganic insulating film of silicon oxide, silicon nitride, silicon nitride oxide, silicon oxynitride, aluminum oxide, aluminum nitride, aluminum nitride oxide, or the like. In particular, the insulating film 929 is preferably formed using a material with a low dielectric constant (a low-k material) because capacitance due to overlap of electrodes or wirings can be sufficiently reduced. Note that the insulating film 929 may be a porous insulating film containing any of the above materials. Since the porous insulating film has lower dielectric constant than a dense insulating film, parasitic capacitance due to electrodes or wirings can be further reduced. In this embodiment, the insulating film 929 is a stack of a silicon oxide film with a thickness of about 300 nm on a 50-nm-thick aluminum oxide film.

The oxide semiconductor films 933 and 934 can be formed by processing an oxide semiconductor film formed over the insulating film 929 into a desired shape. The thickness of the oxide semiconductor film is 2 nm to 200 nm, preferably 3 nm to 50 nm, more preferably 3 nm to 20 nm. The oxide semiconductor film is formed by sputtering using an oxide semiconductor target. Moreover, the oxide semiconductor film can be formed by sputtering under a rare gas (e.g., argon) atmosphere, an oxygen atmosphere, or a mixed atmosphere of a rare gas (e.g., argon) and oxygen.

Note that before the oxide semiconductor film is formed by sputtering, dust on a surface of the insulating film 929 is preferably removed by reverse sputtering in which an argon gas is introduced and plasma is generated. The reverse sputtering refers to a method in which, without application of voltage to a target side, an RF power source is used for application of voltage to a substrate side in an argon atmosphere to generate plasma in the vicinity of the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Further alternatively, an argon atmosphere to which chlorine, carbon tetrafluoride, or the like is added may be used.

As the oxide semiconductor, any of the following oxides can be used, for example: indium oxide, tin oxide, zinc oxide, two-component metal oxides such as In—Zn-based oxide, Sn—Zn-based oxide, Al—Zn-based oxide, Zn—Mg-based oxide, Sn—Mg-based oxide, In—Mg-based oxide, and In—Ga-based oxide; three-component metal oxides such as In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, and In—Lu—Zn-based oxide; and four-component oxides such as In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide. The oxide semiconductor may contain silicon.

In this embodiment, an In—Ga—Zn-based oxide semiconductor thin film that has a thickness of 30 nm and is obtained by sputtering using a target including indium (In), gallium (Ga), and zinc (Zn) is used as the oxide semiconductor film. As the target, it is preferable to use a target having an atomic ratio of In:Ga:Zn=1:1:1, 4:2:3, 3:1:2, 1:1:2, 2:1:3, or 3:1:4. The filling rate of the target including In, Ga, and Zn is 90% or higher and 100% or lower, and preferably 95% or higher and lower than 100%. With the use of the target with high filling rate, a dense oxide semiconductor film is formed.

In the case where an In—Zn-based material is used for the oxide semiconductor film, a target to be used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=1.5:1 to 15:1 in an atomic ratio ($In_2O_3$:ZnO=3:4 to 15:2 in a molar ratio). For example, in a target used for formation of an In—Zn-based oxide semiconductor with an atomic ratio of In:Zn:O=X:Y:Z, the relation of Z>1.5X+Y is satisfied. The mobility can be improved by keeping the ratio of Zn within the above range.

In the case where an In—Sn—Zn-based oxide semiconductor film is formed as the oxide semiconductor film by sputtering, it is preferable to use an In—Sn—Zn—O target having an atomic ratio of In:Sn:Zn=1:1:1, 2:1:3, 1:2:2, or 20:45:35.

In this embodiment, the oxide semiconductor film is formed in such a manner that the substrate is held in a treatment chamber kept in a reduced pressure state, a sputtering gas from which hydrogen and moisture are removed is introduced while moisture remaining in the treatment chamber is removed, and the above-described target is used. The substrate temperature during the film formation may be 100° C. to 600° C., preferably 200° C. to 400° C. By forming the oxide semiconductor film while the substrate is heated, the concentration of impurities included in the formed oxide semiconductor film can be reduced. In addition, damage by sputtering can be reduced. In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with the cryopump, for example, a hydrogen atom, a compound containing a hydrogen atom, such as water ($H_2O$), and the like are removed, whereby the impurity concentration in the oxide semiconductor film formed in the treatment chamber can be reduced.

As one example of the deposition conditions, the distance between the substrate and the target is 100 mm, the pressure is 0.6 Pa, the direct-current (DC) power is 0.5 kW, and the atmosphere is an oxygen atmosphere (the proportion of the oxygen flow rate is 100%). Note that a pulsed direct-current (DC) power source is preferably used because dust generated in deposition can be reduced and the film thickness can be made uniform.

When the leakage rate of the treatment chamber of the sputtering apparatus is set to $1\times10^{-10}$ Pa·m$^3$/s or less, entry of impurities such as an alkali metal or a hydride into the oxide semiconductor film that is formed by sputtering can be reduced. Further, with the use of an entrapment vacuum pump as an exhaustion system, counter flow of impurities such as an alkali metal, hydrogen atoms, hydrogen molecules, water, or a hydride from the exhaustion system can be reduced.

When the purity of the target is set to 99.99% or higher, an alkali metal, hydrogen atoms, hydrogen molecules, water, a hydroxyl group, a hydride, or the like mixed into the oxide semiconductor film can be reduced. In addition, when the above target is used, the concentration of an alkali metal such as lithium, sodium, or potassium can be reduced in the oxide semiconductor film.

In order that the oxide semiconductor film contains as little hydrogen, a hydroxyl group, and moisture as possible, it is preferable that impurities such as moisture or hydrogen that are adsorbed on the substrate 900 be desorbed and exhausted by preheating of the substrate 900 over which the insulating film 929 is formed in a preheating chamber of a sputtering apparatus, as pretreatment for deposition. The temperature for the preheating is 100° C. to 400° C., preferably 150° C. to 300° C. As an evacuation unit provided in the preheating chamber, a cryopump is preferably used. Note that this preheating treatment can be omitted.

Note that etching for forming the oxide semiconductor films 933 and 934 may be dry etching, wet etching, or both dry etching and wet etching. As an etching gas used for dry etching, it is preferable to use a gas containing chlorine (a chlorine-based gas such as chlorine ($Cl_2$), boron trichloride ($BCl_3$), silicon tetrachloride ($SiCl_4$), or carbon tetrachloride ($CCl_4$)). Alternatively, it is possible to use a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like.

As the dry etching method, a parallel plate RIE (reactive ion etching) method or an ICP (inductively coupled plasma) etching method can be used. In order to etch the film into a desired shape, the etching conditions (e.g., the electric power applied to a coiled electrode, the electric power applied to an electrode on the substrate side, and the electrode temperature on the substrate side) are adjusted as appropriate.

As an etchant used for the wet etching, a mixed solution of phosphoric acid, acetic acid, and nitric acid, or organic acid such as citric acid or oxalic acid can be used. In this embodiment, ITO-07N (produced by Kanto Chemical Co., Inc.) is used.

A resist mask used for forming the oxide semiconductor films 933 and 934 may be formed by an inkjet method. Formation of the resist mask by an inkjet method needs no photomask; thus, fabrication cost can be reduced.

Note that it is preferable that reverse sputtering is performed before the formation of a conductive film in a subsequent step so that a resist residue and the like that attach onto surfaces of the oxide semiconductor films 933 and 934 and the insulating film 929 are removed.

Note that the oxide semiconductor film formed by sputtering or the like sometimes contains a large amount of moisture or hydrogen (including a hydroxyl group) as impurities. Moisture or hydrogen easily forms donor levels and thus serves as impurities in the oxide semiconductor. Therefore, in one embodiment of the present invention, in order to reduce impurities such as moisture and hydrogen in the oxide semiconductor film (dehydrate or dehydrogenate the oxide semiconductor film), the oxide semiconductor films 933 and 934 is subjected to heat treatment in a reduced-pressure atmosphere, an inert gas atmosphere of nitrogen, a rare gas, or the like, an oxygen gas atmosphere, or an ultra-dry air atmosphere (with a moisture content of 20 ppm (−55° C. by conversion into a dew point) or less, preferably 1 ppm or less, further preferably 10 ppb or less, in the case where the measurement is performed by a dew point meter of a cavity ring down laser spectroscopy (CRDS) system).

By performing heat treatment on the oxide semiconductor films 933 and 934, moisture or hydrogen in the oxide semiconductor films 933 and 934 can be eliminated. Specifically, heat treatment may be performed at a temperature higher than or equal to 250° C. and lower than or equal to 750° C., preferably higher than or equal to 400° C. and lower than the strain point of the substrate. For example, heat treatment may be performed at 500° C. for approximately 3 to 6 minutes. When RTA is used for the heat treatment, dehydration or dehydrogenation can be performed in a short time; thus, treatment can be performed even at a temperature higher than the strain point of a glass substrate.

In this embodiment, an electrical furnace which is one of heat treatment apparatuses is used.

Note that the heat treatment apparatus is not limited to an electric furnace, and may have a device for heating an object by heat conduction or heat radiation from a heating element such as a resistance heating element. For example, an RTA (rapid thermal annealing) apparatus such as a GRTA (gas rapid thermal annealing) apparatus or an LRTA (lamp rapid thermal annealing) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object by heat treatment, like nitrogen or a rare gas such as argon is used.

In the heat treatment, it is preferable that moisture, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably 6N (99.9999%) or higher, more preferably 7N (99.99999%) or higher (i.e., the impurity concentration is preferably 1 ppm or lower, more preferably 0.1 ppm or lower).

Through the above-described steps, the concentration of hydrogen in the oxide semiconductor films 933 and 934 can be reduced and the oxide semiconductor film can be highly purified. Thus, the oxide semiconductor film can be stable. In addition, by using the oxide semiconductor film in which the hydrogen concentration is reduced and the purity is improved, it is possible to fabricate a transistor with high withstand voltage and extremely low off-state current. The above heat treatment can be performed at any time after the oxide semiconductor film is formed.

Note that the oxide semiconductor film may be amorphous or may have crystallinity. As a crystalline oxide semiconductor film, a CAAC-OS film (c-axis aligned crystalline oxide semiconductor film) including crystals with c-axis orientation (CAAC) is also preferable because the effect of improving the reliability of a transistor can be obtained.

Sputtering may be performed to form an oxide semiconductor film including a CAAC-OS film. In order to obtain a CAAC-OS film by sputtering, it is important to form hexagonal crystals in an initial stage of deposition of an oxide semiconductor film and to cause crystal growth from the hexagonal crystals as cores. In order to achieve this, it is preferable that the distance between the target and the substrate be made to be longer (e.g., 150 mm to 200 mm) and a substrate heating temperature be 100° C. to 500° C., more preferably 200° C. to 400° C., still preferably 250° C. to 300° C. In addition to this, the deposited oxide semiconductor film is subjected to heat treatment at a temperature higher than the substrate heating temperature in the deposition. Thus, micro-defects in the film and defects at the interface of a stacked layer can be compensated.

Next, the source or drain electrode layers 935, 936 and 937 are formed by a photolithography process. Specifically, these electrode layers can be formed in such a manner that a conductive film is formed over the insulating film 929 by sputtering or vacuum evaporation and then processed (patterned) into a predetermined shape.

The source or drain electrode layers 935, 936 and 937 can be formed using any of the following materials: an element selected from aluminum, chromium, copper, tantalum, titanium, molybdenum, and tungsten; an alloy containing any of these elements; an alloy film containing the above elements in combination; and the like. Alternatively, a structure may be employed in which a film of a refractory metal such as chromium, tantalum, titanium, molybdenum, or tungsten is stacked over or below a metal film of aluminum, copper, or the like. Aluminum or copper is preferably used in combination with a refractory metal material in order to avoid problems with heat resistance and corrosion. As the refractory metal material, molybdenum, titanium, chromium, tantalum, tungsten, neodymium, scandium, yttrium, or the like can be used.

The conductive film used to form the source or drain electrode layers 935, 936, and 937 may have a single-layer structure or a stacked structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in that order, and the like can be given. A Cu—Mg—Al alloy, a Mo—Ti alloy, Ti, and Mo have high adhesiveness with an oxide film; therefore, when the source or drain electrode layers 935, 936, and 937 have a stacked structure in which a conductive film of Cu is stacked over a conductive film of a Cu—Mg—Al alloy, a Mo—Ti alloy, Ti, or Mo, the adhesion between the insulating film 929 and the source or drain electrode layers 935, 936, and 937 can be increased.

Alternatively, the conductive film used to form the source or drain electrode layers 935, 936, and 937 may be formed using a conductive metal oxide. As the conductive metal oxide, indium oxide, tin oxide, zinc oxide, a mixture of indium oxide and tin oxide, a mixture of indium oxide and zinc oxide, or the conductive metal oxide material containing silicon or silicon oxide can be used.

In the case where heat treatment is performed after formation of the conductive film, the conductive film preferably has heat resistance enough to withstand the heat treatment.

In this embodiment, a 100-nm-thick tungsten film is used for the source or drain electrode layers 935, 936, and 937.

Note that the materials and etching conditions are adjusted as appropriate so that the oxide semiconductor films 933 and 934 are not removed as much as possible in etching of the conductive film. Depending on the etching conditions, an exposed portion of the oxide semiconductor films 933 and 934 is partially etched and thus a groove (a recessed portion) is formed in some cases.

In this embodiment, a tungsten film is used as the conductive film to be the source or drain electrode layers 935, 936, and 937. Thus, wet etching can be selectively performed on the conductive film using a solution containing ammonia and hydrogen peroxide water (an ammonia hydrogen peroxide mixture). As the ammonia hydrogen peroxide mixture, a solution in which 31 wt % hydrogen peroxide water, 28 wt % ammonia water, and water are mixed at a volume ratio of 5:2:2 is specifically used. Alternatively, dry etching may be performed on the conductive film with the use of a gas containing carbon tetrafluoride ($CF_4$) chlorine ($Cl_2$), or oxygen.

In order to reduce the number of photomasks and steps in a photolithography process, etching may be performed with the use of a resist mask formed using a multi-tone mask which is a light-exposure mask through which light is transmitted so as to have a plurality of intensities. A resist mask formed using a multi-tone mask has a plurality of thicknesses and can be changed in shape by etching; thus, the resist mask can be used in a plurality of etching steps for processing films into different patterns. Thus, a resist mask corresponding to at least two kinds of different patterns can be formed by one multi-tone mask. As a result, the number of light-exposure masks can be reduced and the number of corresponding photolithography processes can also be reduced, whereby the fabrication process can be simplified.

Further, oxide conductive films functioning as a source region and a drain region may be provided between the oxide semiconductor films 933 and 934 and the source or drain electrode layers 935, 936, and 937. The material of the oxide conductive films preferably contains zinc oxide as a component and preferably does not contain indium oxide. For such an oxide conductive film, zinc oxide, zinc aluminum oxide, zinc aluminum oxynitride, gallium zinc oxide, or the like can be used.

For example, in the case where the oxide conductive films are formed, etching for forming the oxide conductive films and etching for forming the source or drain electrode layers 935, 936, and 937 may be performed concurrently.

By providing the oxide conductive films functioning as the source region and the drain region, the resistance between the oxide semiconductor films 933 and 934 and the source or drain electrode layers 935, 936, and 937 can be lowered, so that the transistor can operate at high speed. In addition, with provision of the oxide conductive films functioning as the source region and the drain region, the withstand voltage of the transistor can be increased.

Next, plasma treatment may be performed using a gas such as $N_2O$, $N_2$, or Ar. By this plasma treatment, water or the like attached onto an exposed surface of the oxide semiconductor film is removed. Plasma treatment may be performed using a mixture gas of oxygen and argon as well.

After the plasma treatment, the gate insulating film 938 is formed to cover the source or drain electrode layers 935, 936, and 937 and the oxide semiconductor films 933 and 934. Then, over the gate insulating film 938, the gate electrode layers 939 and 940 are formed to overlap the oxide semiconductor films 933 and 934.

The gate insulating film 938 can be formed using a silicon oxynitride film, for example. Note that the gate insulating film 938 preferably includes impurities such as moisture or hydrogen as little as possible, and the gate insulating film 938 may be a single-layer insulating film or a plurality of insulating films stacked. If hydrogen is contained in the gate insulating film 938, hydrogen enters the oxide semiconductor films 933 and 934 or oxygen in the oxide semiconductor films 933 and 934 is extracted by hydrogen, whereby the oxide semiconductor films 933 and 934 have lower resistance (n-type conductivity) and a parasitic channel might be formed as a result. Thus, it is important that a deposition method in which hydrogen is not used be employed in order to form the gate insulating film 938 containing hydrogen as little as possible. A material having a high barrier property is preferably used for the gate insulating film 938. As the insulating film having a high barrier property, a silicon nitride film, a silicon nitride oxide film, an aluminum nitride film, or an aluminum nitride oxide film can be used, for example. When a plurality of insulating films stacked are used, an insulating film having a lower proportion of nitrogen, such as a silicon oxide film or a silicon oxynitride film, is formed closer to the oxide semiconductor films 933 and 934 than the insulating film having a high barrier property. Then, the insulating film having a high barrier property is formed to overlap the source or drain electrode layers 935, 936, and 937 and the oxide semiconductor films 933 and 934 with the insulating film having a lower proportion of nitrogen placed therebetween. With the use of the insulating film having a high barrier property, impurities such as moisture and hydrogen can be prevented from entering the oxide semiconductor films 933 and 934, the gate insulating film 938, or the interface between the oxide semiconductor films 933 and 934 and another insulating film and the vicinity thereof. In addition, the insulating film having a lower proportion of nitrogen, such as a silicon oxide film or a silicon oxynitride film, formed in contact with the oxide semiconductor films 933 and 934 can prevent the insulating film formed using a material having a high barrier property from being in direct contact with the oxide semiconductor films 933 and 934.

In this embodiment, a 20-nm-thick silicon oxynitride film formed by sputtering is used as the gate insulating film 938. The substrate temperature during the film formation may range from room temperature to 400° C. and is 300° C. in this embodiment.

After the gate insulating film 938 is formed, heat treatment may be performed. The heat treatment is performed in a nitrogen atmosphere, ultra-dry air, or a rare gas (e.g., argon or helium) atmosphere preferably at 200° C. to 400° C., and for example at 250° C. to 350° C. It is preferable that the water content in the gas be 20 ppm or less, preferably 1 ppm or less, further preferably 10 ppb or less. In this embodiment, for example, heat treatment is performed at 250° C. for 1 hour in a nitrogen atmosphere. Alternatively, RTA treatment for a short time at a high temperature may be performed before the formation of the source or drain electrode layers 935, 936, and 937 in a manner similar to that of the heat treatment performed on the oxide semiconductor film for reduction of moisture or hydrogen. Even when oxygen vacancies are generated in the oxide semiconductor films 933 and 934 by the previous heat treatment performed on the oxide semiconductor films 933 and 934, oxygen is supplied to the oxide semiconductor films 933 and 934 from the gate insulating film 938 by performing heat treatment after the gate insulating film 938 containing oxygen is provided. By the supply of oxygen to the oxide semiconductor films 933 and 934, oxygen vacancies that serve as donors can be reduced in the oxide semiconductor films 933 and 934 and the stoichiometric composition can be recovered. As a result, the oxide semiconductor films 933 and 934 can be made to be substantially i-type and variation in electrical characteristics of the transistor due to oxygen vacancies can be reduced; thus, electrical characteristics can be improved. There is no particular limitation on the timing of this heat treatment as long as it is after the formation of the gate insulating film 938. When this heat treatment doubles as another step, the oxide semiconductor films 933 and 934 can be made to be substantially i-type without increase in the number of steps.

Moreover, oxygen vacancies that serve as donors in the oxide semiconductor films 933 and 934 may be reduced by subjecting the oxide semiconductor films 933 and 934 to heat treatment in an oxygen atmosphere so that oxygen is added to the oxide semiconductor. The heat treatment is performed at a temperature of, for example, higher than or equal to 100° C. and lower than 350° C., preferably higher than or equal to 150° C. and lower than 250° C. It is preferable that an oxygen gas used for the heat treatment in an oxygen atmosphere do not include water, hydrogen, or the like. Alternatively, the purity of the oxygen gas which is introduced into the heat treatment apparatus is preferably 6N (99.9999%) or higher, further preferably 7N (99.99999%) or higher (i.e., the impurity concentration in the oxygen gas is preferably 1 ppm or lower, further preferably 0.1 ppm or lower).

Alternatively, oxygen may be added to the oxide semiconductor films 933 and 934 by ion implantation, ion doping, or the like to reduce oxygen vacancies serving as donors. For example, oxygen that is made into a plasma state with a microwave at 2.45 GHz may be added to the oxide semiconductor films 933 and 934.

The gate electrode layers 939 and 940 can be formed in such a manner that a conductive film is formed over the gate insulating film 938 and then is patterned.

The thickness of each of the gate electrode layers 939 and 940 is 10 nm to 400 nm, preferably 100 nm to 300 nm. In this embodiment, the gate electrode layers 939 and 940 are formed in the following manner: a 135-nm-thick tungsten film is stacked over a 30-nm-thick tantalum nitride film by sputtering to form a conductive film for the gate electrode, and then, the conductive film is processed (patterned) into a desired shape by etching. Note that a resist mask may be formed by an inkjet method. Formation of the resist mask by an inkjet method needs no photomask; thus, fabrication cost can be reduced.

Through the above steps, the OS-FETs 944 and 945 are formed.

In the fabrication method described above, the source or drain electrode layers 935, 936, and 937 are formed after the oxide semiconductor films 933 and 934. Accordingly, as illustrated in FIG. 6, in the OS-FETs 944 and 945 which are obtained by the fabrication method, the source or drain electrode layers 935, 936, and 937 are formed over the oxide semiconductor films 933 and 934. Alternatively, in the OS-FETs 944 and 945, the source or drain electrode layers 935, 936, and 937 may be formed below the oxide semiconductor films 933 and 934, that is, between the oxide semiconductor films 933 and 934 and the insulating film 929.

Note that insulating films in contact with the oxide semiconductor films 933 and 934 may be formed using an insulating material containing an element that belongs to Group 13 and oxygen. Many of oxide semiconductor materials contain a Group 13 element, and an insulating material containing a Group 13 element is compatible with such an oxide semiconductor. Thus, when an insulating material containing a Group 13 element is used for the insulating film in contact with the oxide semiconductor film, the state of the interface between the oxide semiconductor film and the insulating film can be kept favorable.

An insulating material containing a Group 13 element is an insulating material containing one or more Group 13 elements. Examples of the insulating material containing a Group 13 element are gallium oxide, aluminum oxide, aluminum gallium oxide, and gallium aluminum oxide. Here, aluminum gallium oxide refers to a material in which the aluminum content is higher than the gallium content in atomic percent, and gallium aluminum oxide refers to a material in which the gallium content is higher than or equal to the aluminum content in atomic percent.

For example, when a material containing gallium oxide is used for an insulating film that is in contact with an oxide semiconductor film containing gallium, characteristics at the interface between the oxide semiconductor film and the insulating film can be kept favorable. For example, when the oxide semiconductor film and an insulating film containing gallium oxide are provided in contact with each other, pile up of hydrogen at the interface between the oxide semiconductor film and the insulating film can be reduced. Note that a similar effect can be obtained when an element in the same group as a constituent element of the oxide semiconductor is used in an insulating film. For example, it is effective to form an insulating film with the use of a material containing aluminum oxide. Note that water is less likely to permeate aluminum oxide, and it is therefore preferable to use a material containing aluminum oxide in terms of preventing entry of water to the oxide semiconductor film.

The insulating film which is in contact with the oxide semiconductor films 933 and 934 preferably contains oxygen in a proportion higher than the stoichiometric composition by heat treatment in an oxygen atmosphere, oxygen doping, or the like. Oxygen doping is addition of oxygen into a bulk. Note that the term "bulk" is used in order to clarify that oxygen is added not only to a surface of a thin film but also to the inside of the thin film. In addition, the term "oxygen doping" includes oxygen plasma doping in which oxygen that is made to be plasma is added to a bulk. The oxygen doping may be performed by ion implantation or ion doping.

By oxygen doping, an insulating film that includes a region where the proportion of oxygen is higher than that in the stoichiometric composition can be formed. When the insulating film including such a region is in contact with the oxide semiconductor film, excess oxygen in the insulating film is supplied to the oxide semiconductor film, and oxygen defects in the oxide semiconductor film or at the interface between the oxide semiconductor film and the insulating film are reduced. Thus, the oxide semiconductor film can be made to be an i-type or substantially i-type oxide semiconductor.

Note that the insulating film including a region where the proportion of oxygen is higher than that in the stoichiometric composition may be used as either the insulating film placed above the oxide semiconductor films 933 and 934 or the insulating film placed below the oxide semiconductor films 933 and 934 of the insulating films in contact with the oxide semiconductor films 933 and 934; however, it is preferable to use such an insulating film as both of the insulating films in contact with the oxide semiconductor films 933 and 934. The above-described effect can be enhanced with a structure where the insulating films including a region where the proportion of oxygen is higher than that in the stoichiometric composition are used as insulating films placed above and below the insulating films in contact with the oxide semiconductor films 933 and 934 so that the oxide semiconductor films 933 and 934 is sandwiched between the insulating films.

The insulating films placed above and below the oxide semiconductor films 933 and 934 may contain the same constituent elements or different constituent elements. The insulating film in contact with the oxide semiconductor films 933 and 934 may be a stack of insulating films each including a region where the proportion of oxygen is higher than that in the stoichiometric composition.

Note that a top-gate structure is used for the OS-FETs 944 and 945 in this embodiment; however, a back gate electrode layer (not shown) can be provided for the OS-FETs 944 and 945. The back gate electrode layer is an electrode layer provided in a position opposite to the gate electrode layers 939 and 940 so that the oxide semiconductor films are interposed between the back gate electrode layer and the gate electrode layers 939 and 940. The application of predetermined voltage to the electrode layer enables the OS-FETs 944 and 945 to be operated as normally-off transistors. For example, when the potential of the back gate electrode layer is set at GND or a fixed potential, the threshold voltage of the OS-FETs 944 and 945 can shift further in a positive direction, which further enables the OS-FETs 944 and 945 to be operated as normally-off transistors.

In order to electrically connect the MOSFETs 903 and 904 and the OS-FETs 944 and 945 to form an electric circuit including the protection circuit portion and the detecting portion, one or more wiring layers for connecting these elements are stacked between layers and on the upper layer.

In FIG. 6, in order to form the measurement device described in Embodiment 1, the impurity region 905 (drain region) of the MOSFET 903 is electrically connected to the wiring layer 928 via the contact plug 922. The wiring layer 928 is electrically connected to a power source for applying a high-potential-side potential and serves as a power supply line. The impurity region 906 is shared by the MOSFETs 903 and 904 and serves as a source region of the MOSFET 903 and a drain region of the MOSFET 904. The impurity region 906 is electrically connected to the wiring layer 926 via the contact plug 920. The wiring layer 926 serves as an output of the detecting portion. The impurity region 907 (source region) of the MOSFET 904 is electrically connected to the wiring layer 924 via the contact plug 918. The wiring layer 924 is electrically connected to a power source for applying a low-potential-side potential and serves as a power supply line. The gate electrode layer 909 of the MOSFET 903 is electrically connected to the drain electrode layer 936 electrically connected to the OS-FET 944 and the source electrode layer 936 electrically connected to the OS-FET 945, via the contact plug 921, the wiring layer 927, and the contact plug 931. Further, the gate electrode layer 913 of the MOSFET 904 is electrically connected to the wiring layer 925 via the contact plug 919. The wiring layer 925 serves as a wiring for applying predetermined voltage to the gate of the MOSFET 904.

The source electrode layer 935 which is electrically connected to the OS-FET 944 is electrically connected to the wiring layer 928 via the contact plug 932. The drain electrode layer 937 which is electrically connected to the OS-FET 945 is electrically connected to the wiring layer 924 via the contact plug 930. The drain electrode layer 936 which is electrically connected to the OS-FET 944 and the source electrode layer 936 which is electrically connected to the OS-FET 945 are electrically connected to an input terminal layer 949 which is electrically connected to a probe needle, via the contact plug 943 and the wiring 947.

Because the input terminal layer 949 is in the uppermost layer of a stacked structure and is exposed, the input terminal layer 949 is preferably formed using a conductive material which is not easily oxidized. Hence, a thin film including gold or the like may be used, for example. Further, an oxide semiconductor material such as ITO may be used.

The wiring layers 924, 925, 926, 927, 928, and 947 are embedded in insulating films. These wiring layers and the like are preferably formed using a low-resistance conductive material such as copper or aluminum. Alternatively, the wiring layers can be formed using graphene formed by CVD as a conductive material. Graphene is a one-atom thick sheet of $sp^2$-bonded carbon molecules or a stack of 2 to 100 sheets of the carbon molecules. Examples of a method of manufacturing such graphene are thermal CVD by which graphene is formed on a metal catalyst; and plasma CVD by which graphene is formed from methane, without using a catalyst, by plasma generated locally with ultraviolet light irradiation.

By using such a low-resistance conductive material, RC delay of signals transmitted through the wiring layers can be reduced. When copper is used for the wiring layers, a barrier film is formed in order to prevent copper from diffusing into the channel formation region. The barrier film can be a tantalum nitride film, a stack of a tantalum nitride film and a tantalum film, a titanium nitride film, or a stack of a titanium nitride film and a titanium film, for example, but is not limited to a film containing such materials as long as the film has a function of preventing diffusion of a wiring material and has adhesion to the wiring material, a base film, or the like. The barrier film may be formed as a layer that is independently formed, or may be formed in such a manner that a material of the barrier film is included in a wiring material and precipitated by heat treatment on the inner wall of an opening provided in an insulating film.

The insulating films 917, 923, 942, and 946 can be formed using an insulator such as silicon oxide, silicon oxynitride, silicon nitride oxide, borophosphosilicate glass (BPSG), phosphosilicate glass (PSG), silicon oxide to which carbon is added (SiOC), silicon oxide to which fluorine is added (SiOF), tetraethylorthosilicate (TEOS) which is silicon oxide prepared from $Si(OC_2H_5)_4$, hydrogen silsesquioxane (HSQ), methyl silsesquioxane (MSQ), organosilicate glass (OSG), or an organic polymer-based material. In particular, in the case of advancing miniaturization of a semiconductor device, parasitic capacitance between wirings is significant and signal delay is increased; therefore, the relative permittivity of silicon oxide (k=4.0 to 4.5) is too high, and a material with k=3.0 or less is preferably used. In addition, since CMP treatment is performed after the wirings are embedded in the insulating films, the insulating films need to have high mechanical strength. The insulating films can be made porous to have a lower dielectric constant as long as their mechanical strength can be secured. The insulating films are formed by sputtering, CVD, a coating method including spin coating (also referred to as spin on glass (SOG)), or the like.

An insulating film functioning as an etching stopper for planarization treatment by CMP or the like that is performed after the wiring material is embedded in the insulating films 917, 923, 942, and 946 may be additionally provided Barrier films are provided over the wiring layers 924, 925, 926, 927, 928, and 947 and a protective film is provided over each barrier film. The barrier film is provided in order to prevent diffusion of the wiring material such as copper. The barrier film can be formed using an insulating material such as silicon nitride, SiC, or SiBON. Note that a thick barrier film increases capacitance between wirings; therefore, a material having a barrier property and a low dielectric constant is preferably used.

Each of the contact plugs 918, 919, 920, 921, 922, 930, 931, 932, and 943 is formed in such a manner that an opening (a via hole) with a high aspect ratio is formed in the insulating film and is filled with a conductive material such as tungsten. The opening is formed preferably by highly anisotropic dry etching and particularly preferably by reactive ion etching (RIE). The inner wall of the opening is covered with a barrier film (diffusion prevention film) formed of a titanium film, a titanium nitride film, a stack of such films, or the like, and a material such as tungsten or polysilicon doped with phosphorus or the like fills the opening. For example, tungsten is embedded in the via hole by blanket CVD, and an upper surface of the contact plug is planarized by CMP.

A protective insulating film 948 is provided over the wiring 947 and the insulating film 946 and prevents moisture and contaminant from entering a measurement device from the outside. The protective insulating film 948 can have a single-layer structure or a stacked structure using a material such as silicon nitride, silicon oxynitride, or silicon nitride oxide.

Next, a cross-sectional structure of the case where, as an example of another structure of the OS-FET, an OS-FET with a bottom-gate structure is used for the protection circuit portion is described with reference to FIG. 7.

Figure 7:
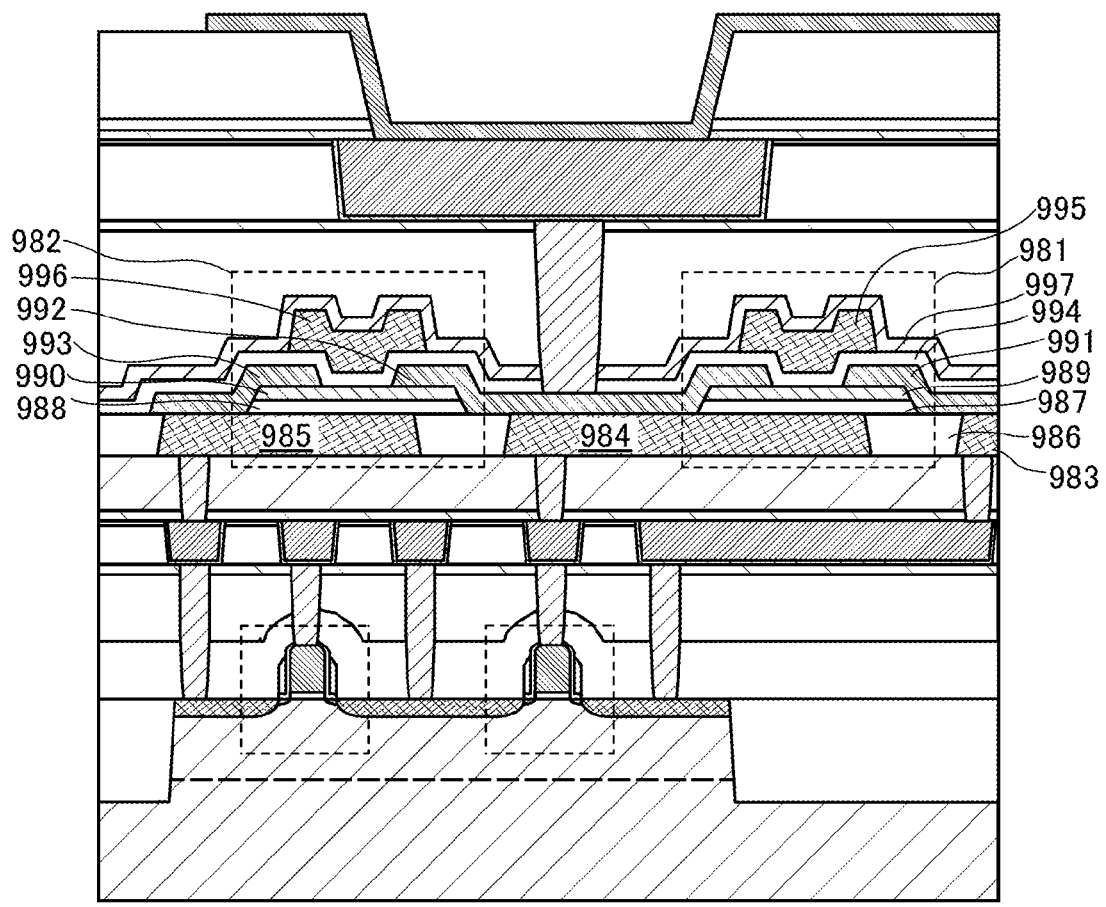
FIG. 7 is a cross-sectional view illustrating one mode of a semiconductor device.

FIG. 7 illustrates an embodiment of a cross-sectional structure showing the circuit structures of the protection circuit portion 210 and the detecting portion 211 in the measurement device described in Embodiment 1. The only difference from the cross-sectional structure illustrated in FIG. 6 is that the OS-FET in the protection circuit portion has a bottom-gate structure. OS-FETs 981 and 982 using an oxide semiconductor correspond to the OS-FETs 203 and 204 in Embodiment 1 The measurement device illustrated in FIG. 7 is also a measurement device that has a three-dimensional layered structure in which a silicon wafer is used as a substrate and an oxide semiconductor film is provided above the silicon wafer. Moreover, the measurement device in this embodiment is also a hybrid measurement device including a transistor in which silicon is used for a channel formation region and a transistor in which an oxide semiconductor is used for a channel formation region.

The OS-FET 981 includes a gate electrode layer 984 and an oxide semiconductor film 989 including a channel formation region provided over the gate electrode layer 984 with a gate insulating film 987 provided between the gate electrode layer 984 and the oxide semiconductor film 989. A source electrode layer 991 and a drain electrode layer 992 are provided in contact with a part of side surfaces and a top surface of the oxide semiconductor film 989. A back gate electrode layer 995 is provided over the channel formation region in the oxide semiconductor film 989 with an insulating film 994 provided therebetween. These are covered with an insulating film 997.

Similarly, the OS-FET 982 includes a gate electrode layer 985 and an oxide semiconductor film 990 including a channel formation region provided over the gate electrode layer 985 with a gate insulating film 988 provided between the gate electrode layer 985 and the oxide semiconductor film 990. A source electrode layer 992 and a drain electrode layer 993 are provided in contact with a part of side surfaces and a top surface of the oxide semiconductor film 990. A back gate electrode layer 996 is provided over the channel formation region in the oxide semiconductor film 990 with the insulating film 994 provided therebetween. These are covered with the insulating film 997.

The gate electrode layers 984 and 985 and an electrode layer 983, which have been processed into desired shapes, are covered with an insulating film 986 and planarized by CMP treatment. Over the resulting flat surface, the gate insulating films 987 and 988 and the oxide semiconductor film 989 and 990 are stacked and patterned into island-like shapes by etching treatment. Hence, the source or drain electrode layers 991, 992, and 993 are in contact with side surfaces of the oxide semiconductor films 989 and 990 and the gate insulating films 987 and 988.

In the OS-FET 981, the drain electrode layer 992 is electrically connected to the gate electrode layer 984. In the OS-FET 982, the drain electrode layer 993 is electrically connected to the gate electrode layer 985. In this manner, the protection circuit portion including the diode-connected OS-FETs 981 and 982 with a bottom-gate structure is formed in the upper layer of the stacked structure.

Note that in FIG. 7, the back gate electrode layer is formed in each OS-FET. The application of predetermined voltage to the back gate electrode layer enables the OS-FETs 981 and 982 to be operated as normally-off transistors. For example, when the potential of the back gate electrode layer is set at GND or a fixed potential, the threshold voltage of the OS-FETs 981 and 982 can shift further in a positive direction, which further enables the OS-FETs 981 and 982 to be operated as normally-off transistors.

With the above-described structure of the measurement device, a predetermined level of resistance to ESD can be ensured and leakage current can be made low. Thus, voltage can be accurately measured for a long time without adversely affecting the device under test.

Further, the MOSFET for voltage detection in the detecting portion can be provided to be extremely close to the protection circuit. Hence, it is possible to inhibit ESD, which occurs when the MOSFET and the protection circuit are provided for different element substrates, from occurring in a portion where the substrates are connected to each other. Further, it is possible to inhibit leakage current from occurring.

This embodiment can be implemented in an appropriate combination with any of the other embodiments described in this specification. This application is based on Japanese Patent Application serial no. 2012-117197 filed with Japan Patent Office on May 23, 2012, the entire contents of which are hereby incorporated by reference.

What is claimed is:

1. A measurement device comprising:
   a probe;
   a first transistor configured to detect voltage of a device under test; and
   a protection circuit comprising a second transistor and a third transistor,
   a first line configured to supply a power source potential,
   wherein a gate of the first transistor is electrically connected to the probe, a gate, and a drain of the second transistor, and a source of the third transistor,
   wherein a drain of the first transistor is electrically connected to the first line,
   wherein the protection circuit is provided between the probe and the first transistor,
   wherein a signal from the probe is input to the protection circuit,
   wherein the signal is output from the protection circuit and is input to the first transistor,
   wherein the second transistor and the third transistor each comprise an oxide semiconductor film, and
   wherein a channel formation region of each of the second transistor and the third transistor is provided in the oxide semiconductor film.

2. The measurement device according to claim 1, wherein leakage current of the second transistor in an off state is less than or equal to $10^{-24}$ A.

3. The measurement device according to claim 1,
   wherein an insulating film is provided over the first transistor,
   wherein the second transistor is provided over the insulating film, and
   wherein a channel formation region of the first transistor comprises silicon.

4. A measurement device comprising:
   a probe;
   a first transistor configured to detect voltage of a device under test;
   a protection circuit comprising a second transistor and a third transistor; and
   a first line configured to supply a high power source potential,
   wherein a gate of the first transistor is electrically connected to the probe, a gate and a drain of the second transistor, and a source of the third transistor,
   wherein a drain of the first transistor is electrically connected to the first line,
   wherein a source of the first transistor is electrically connected to a gate and a drain of the third transistor,
   wherein a source of the second transistor is electrically connected to the first line,
   wherein the protection circuit is provided between the probe and the first transistor,
   wherein a signal from the probe is input to the protection circuit,
   wherein the signal is output from the protection circuit and is input to the first transistor,
   wherein the second transistor and the third transistor each comprise an oxide semiconductor film, and
   wherein a channel formation region of each of the second transistor and the third transistor is provided in the oxide semiconductor film.

5. The measurement device according to claim 4, further comprising:
   a fourth transistor;
   a second line configured to supply a low power source potential; and
   a wiring configured to supply a bias potential,
   wherein the source of the first transistor is electrically connected to a drain of the fourth transistor,
   wherein the gate and the drain of the third transistor are electrically connected to the second line,
   wherein a gate of the fourth transistor is electrically connected to the wiring, and
   wherein a source of the fourth transistor is electrically connected to the second line.

6. The measurement device according to claim 4, wherein leakage current of the second transistor in an off state and leakage current of the third transistor in an off state are each less than or equal to $10^{-24}$ A.

7. The measurement device according to claim 4,
   wherein an insulating film is provided over the first transistor,
   wherein the second transistor and the third transistor are provided over the insulating film, and
   wherein a channel formation region of the first transistor comprises silicon.

8. The measurement device according to claim 5, wherein leakage current of the second transistor in an off state and leakage current of the third transistor in an off state are each less than or equal to $10^{-24}$ A.

9. The measurement device according to claim 5,
   wherein an insulating film is provided over the first transistor and the fourth transistor,
   wherein the second transistor and the third transistor are provided over the insulating film, and
   wherein a channel formation region of each of the first transistor and the fourth transistor comprises silicon.

10. A measurement device comprising:
    a probe;
    a first transistor configured to detect voltage of a device under test;
    a protection circuit comprising a second transistor and a third transistor; and
    a first line configured to supply a low power source potential,
    wherein a gate of the first transistor is electrically connected to the probe, a gate and a drain of the second transistor, and a source of the third transistor,
    wherein a drain of the first transistor is electrically connected to the first line,
    wherein a source of the first transistor is electrically connected to a source of the second transistor,
    wherein a drain of the third transistor is electrically connected to the first line,
    wherein the protection circuit is provided between the probe and the first transistor,
    wherein a signal from the probe is input to the protection circuit,
    wherein the signal is output from the protection circuit and is input to the first transistor, wherein the second transistor and the third transistor each comprise an oxide semiconductor film, and wherein a channel formation region of each of the second transistor and the third transistor is provided in the oxide semiconductor film.

11. The measurement device according to claim 10, further comprising:
a fourth transistor;
a second line configured to supply a high power source potential; and
a wiring configured to supply a bias potential,
wherein the source of the first transistor is electrically connected to a drain of the fourth transistor,
wherein the source of the second transistor is electrically connected to the second line,
wherein a gate of the third transistor is electrically connected to the first line,
wherein a gate of the fourth transistor is electrically connected to the wiring, and
wherein a source of the fourth transistor is electrically connected to the second line.

12. The measurement device according to claim 10, wherein leakage current of the second transistor in an off state and leakage current of the third transistor in an off state are each less than or equal to $10^{-24}$ A.

13. The measurement device according to claim 10,
wherein an insulating film is provided over the first transistor,
wherein the second transistor and the third transistor are provided over the insulating film, and
wherein a channel formation region of the first transistor comprises silicon.

14. The measurement device according to claim 11, wherein leakage current of the second transistor in an off state and leakage current of the third transistor in an off state are each less than or equal to $10^{-24}$ A.

15. The measurement device according to claim 11,
wherein an insulating film is provided over the first transistor and the fourth transistor,
wherein the second transistor and the third transistor are provided over the insulating film, and
wherein a channel formation region of each of the first transistor and the fourth transistor comprises silicon.

16. The measurement device according to claim 1, wherein the probe has a needle-like shape.

17. The measurement device according to claim 4, wherein the probe has a needle-like shape.

18. The measurement device according to claim 10, wherein the probe has a needle-like shape.

* * * * *